US010714436B2

(12) United States Patent
Buckalew et al.

(10) Patent No.: US 10,714,436 B2
(45) Date of Patent: Jul. 14, 2020

(54) SYSTEMS AND METHODS FOR ACHIEVING UNIFORMITY ACROSS A REDISTRIBUTION LAYER

(71) Applicant: Lam Research Corporation, Fremont, CA (US)

(72) Inventors: Bryan L. Buckalew, Tualatin, OR (US); Thomas A. Ponnuswamy, Sherwood, OR (US); Steven T. Mayer, Lake Oswego, OR (US); Stephen J. Banik, II, Portland, OR (US); Justin Oberst, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 422 days.

(21) Appl. No.: 15/458,833

(22) Filed: Mar. 14, 2017

(65) Prior Publication Data
US 2017/0243839 A1 Aug. 24, 2017

Related U.S. Application Data

(63) Continuation-in-part of application No. 15/161,081, filed on May 20, 2016, which is a continuation-in-part
(Continued)

(51) Int. Cl.
H01L 23/00 (2006.01)
C25D 7/12 (2006.01)
(Continued)

(52) U.S. Cl.
CPC ............... *H01L 24/02* (2013.01); *C25D 7/123* (2013.01); *C25D 17/001* (2013.01); *C25F 3/22* (2013.01);
(Continued)

(58) Field of Classification Search
CPC ......... H01L 24/02; H01L 23/66; H01L 24/05; H01L 25/105; H01L 2223/6655;
(Continued)

(56) References Cited

U.S. PATENT DOCUMENTS 6,225,745 B1   5/2001   Srivastava
6,527,911 B1   3/2003   Yen et al.
(Continued)

OTHER PUBLICATIONS

West et al. "A superfilling model that predicts bump formation", Electrochemical and Solid-State Letters, 4, 7, C50-053, 2001 (Year: 2001).*

(Continued)

*Primary Examiner* — Xiuyu Tai
(74) *Attorney, Agent, or Firm* — Penilla IP, APC

(57) ABSTRACT

Systems and methods for achieving uniformity across a redistribution layer are described. One of the methods includes patterning a photoresist layer over a substrate. The patterning defines a region for a conductive line and a via disposed below the region for the conductive line. The method further includes depositing a conductive material in between the patterned photoresist layer, such that the conductive material fills the via and the region for the conductive line. The depositing causes an overgrowth of conductive material of the conductive line to form a bump of the conductive material over the via. The method also includes planarizing a top surface of the conductive line while maintaining the patterned photoresist layer present over the substrate. The planarizing is facilitated by exerting a horizontal shear force over the conductive line and the bump. The planarizing is performed to flatten the bump.

15 Claims, 16 Drawing Sheets

Related U.S. Application Data of application No. 14/103,395, filed on Dec. 11, 2013, now Pat. No. 9,523,155.

(60) Provisional application No. 62/286,246, filed on Jan. 22, 2016, provisional application No. 61/736,499, filed on Dec. 12, 2012.

(51) Int. Cl.
  *H01L 23/66* (2006.01)
  *C25F 3/22* (2006.01)
  *C25D 17/00* (2006.01)
  *H01L 25/10* (2006.01)

(52) U.S. Cl.
  CPC .............. *H01L 23/66* (2013.01); *H01L 24/05* (2013.01); *H01L 25/105* (2013.01); *C25D 17/002* (2013.01); *H01L 2223/6655* (2013.01); *H01L 2224/0239* (2013.01); *H01L 2224/02311* (2013.01); *H01L 2224/02331* (2013.01); *H01L 2224/02333* (2013.01); *H01L 2224/02379* (2013.01); *H01L 2224/05008* (2013.01); *H01L 2224/05124* (2013.01); *H01L 2224/05147* (2013.01); *H01L 2224/05184* (2013.01); *H01L 2224/32145* (2013.01); *H01L 2224/48227* (2013.01); *H01L 2224/73265* (2013.01); *H01L 2225/1058* (2013.01); *H01L 2924/01026* (2013.01); *H01L 2924/01027* (2013.01); *H01L 2924/01028* (2013.01); *H01L 2924/01029* (2013.01); *H01L 2924/01402* (2013.01); *H01L 2924/15192* (2013.01); *H01L 2924/15311* (2013.01); *H01L 2924/15313* (2013.01)

(58) Field of Classification Search
  CPC ... H01L 224/02311; H01L 2224/02331; H01L 2224/02333; H01L 2224/02379; H01L 2224/0239; H01L 2224/05008; H01L 2224/05124; H01L 2224/05147; H01L 2224/05184; H01L 2224/32145; H01L 2224/48227; H01L 2224/73265; H01L 2225/1058; H01L 2924/01026; H01L 2924/01027; H01L 2924/01028; H01L 2924/01029; H01L 2924/01402; H01L 2924/15192; H01L 2924/15311; H01L 2924/15313; H01L 24/13; H01L 24/17; H01L 24/14; H01L 24/12; H01L 24/15; H01L 21/563; H01L 23/3114; H01L 23/3128; H01L 24/11; H01L 24/16; H01L 2224/0231; H01L 2224/1147; H01L 2224/11831; H01L 2224/11901; H01L 2924/01013; H01L 2924/01022; H01L 2924/01033; H01L 2924/01073; H01L 2924/01078; H01L 2924/01079; H01L 2924/04941; H01L 2924/09701; H01L 2924/30107; H01L 2924/00013; H01L 2924/01005; H01L 2924/01006; H01L 2924/01041; H01L 2924/01074; H01L 2924/01075; H01L 2940/01084; H01L 2924/014; H01L 2224/13099; H01L 2224/16225; H01L 2224/73204; H01L 2224/32225; H01L 2924/00; H01L 2224/16227; H01L 2224/0401; H01L 2924/351; H01L 2924/181; H01L 21/2885; H01L 21/32125; H01L 21/7684; H01L 21/76877; C25D 7/123; C25D 17/001; C25D 17/002; C25F 3/22; H04B 1/712; H04B 1/7113

See application file for complete search history.

(56) References Cited

U.S. PATENT DOCUMENTS

| | | | |
|---|---|---|---|
| 6,551,487 | B1 | 4/2003 | Reid et al. |
| 6,660,644 | B2 | 12/2003 | Donohoe et al. |
| 7,077,971 | B2 | 7/2006 | Ni et al. |
| 7,396,769 | B2 | 7/2008 | Hudson et al. |
| 7,605,063 | B2 | 10/2009 | Chebi et al. |
| 8,172,646 | B2 | 5/2012 | Feng et al. |
| 8,962,085 | B2 | 2/2015 | Mayer et al. |
| 9,230,819 | B2 | 1/2016 | Paterson et al. |
| 9,469,912 | B2 | 10/2016 | Buckalew et al. |
| 9,523,155 | B2 | 12/2016 | Mayer et al. |
| 2002/0139775 | A1 | 10/2002 | Chang et al. |
| 2002/0166773 | A1* | 11/2002 | Cohen ............... C25D 5/026 205/118 |
| 2003/0038038 | A1* | 2/2003 | Basol ............... C25D 5/02 205/125 |
| 2004/0032592 | A1 | 2/2004 | Venugopal et al. |
| 2006/0009033 | A1* | 1/2006 | Basol ............... H01L 21/2885 438/674 |
| 2008/0113504 | A1* | 5/2008 | Lee ............... H01L 24/13 438/614 |
| 2008/0171292 | A1 | 7/2008 | Hemker et al. |
| 2008/0258299 | A1* | 10/2008 | Kang ............... H01L 24/11 257/737 |
| 2012/0211354 | A1 | 8/2012 | Rasheed et al. |
| 2014/0224661 | A1 | 8/2014 | Spurlin et al. |
| 2015/0118862 | A1 | 4/2015 | Reilly et al. |
| 2015/0299886 | A1 | 10/2015 | Doubina et al. |
| 2016/0273117 | A1 | 9/2016 | Doubina et al. |

OTHER PUBLICATIONS

Anonymous: "Solder Bump Bonding", Custom Search, Mar. 1997, Retrieved from the internet: URL:http://www.eleceng.adelaide.edu.au/Personal/alsarawi/node9.html [retrieved on Dec. 6, 2016]—1 pg.

Anonymous: "Spin coating"—Wikipedia, the free encyclopedia, Retrieved from the internet: URL:https://en.wikipedia.org/w/php?title=Spin_coating&oldid=687103811 [retrieved on Jan. 19, 2017]—1 pg.

Anonymous: "Plasma ashing"—Wikipedia, the free encyclopedia, Retrieved from the internet: URL:https://en.wikipedia.org/wiki/Plasma_ashing [retrieved on Dec. 21, 2016]—1 pg.

Anonymous: "JSR WPR Photosensitive Dielectric Materials | JSR Micro NV", Retrieved from the internet: URL:http://www.jsrmicro.be/electronic-materials/packaging-materials/jsr-wpr-photosensitive-dielectric-materials [retrieved on Jan. 19, 2017]—1 pg.

ClassOne Technology: "Procedure to Optimize the Performance of your Spin Rinse Dryer (SRD)", Retrieved from the internet: URL:http://www.classone.com/articles/procedure-to-optimize-performance-of-your-spin-rinse-dryer-srd/ [retrieved on Jan. 25, 2017]—2 pgs.

Solid State Technology: "RDL: an integral part of today's advanced packaging technologies", Retrieved from the internet: URL:http://electroiq.com/blog/2011/05/rdl-an-integral-part-of-today-s-advanced/ [retrieved on Dec. 6, 2016]—7 pgs.

Anonymous: "Flip chip"—Wikipedia, the free encyclopedia, Dec. 6, 2016, Retrieved from the internet: URL:https://en.wikipedia.org/wiki/Flip_chip [retrieved on Dec. 6, 2016]—1 pg.

IEEE, Hau Lu et al, Design, Modeling, Fabrication and Characterization of 2-5-um Redistribution Layer Traces by Advanced Semiadditive Processes on Low-Cost Panel-Based Glass Interposers, pp. 1-9.

Anonymous: "Photomask"—Wikipedia, the free encyclopedia, Retrieved from the internet: URL:https://en.wikipedia.org/wiki/Photomask [retrieved on Dec. 21, 2016]—4 pgs.

Nikon: "Fabricating high-precision, multifunctional ICs", Retrieved from the internet: URL:http://www.nikon.com/products/precision/technology/ic/story02.htm# [retrieved on Dec. 21, 2016]—2 pgs.

(56) References Cited

OTHER PUBLICATIONS

Sigma-Aldrich: "Physical Vapor Deposition (PVD)", Retrieved from the internet: URL:http://www.sigmaaldrich.com/material-science-products.html?TablePage=108832720 [retrieved on Jan. 19, 2017]—4 pgs.

Anonymous: "Shear force"—Wikipedia, the free encyclopedia, Retrieved from the internet: URL:https://en.wikipedia.org/wiki/Shear_force [retrieved on Jan. 6, 2017]—2 pgs.

Anonymous: "Electroplating"—Wikipedia, the free encyclopedia, Retrieved from the internet: URL:https://en.wikipedia.org/wiki/Electroplating [retrieved on Dec. 21, 2016]—7 pgs.

Jonathan Reid, "Chapter 16. Damascene Copper Electroplating" Handbook of Semiconductor Manufacturing Technology, Second Edition CRC press 2007 pp. 16-1-16-47,—68 pgs.

\* cited by examiner

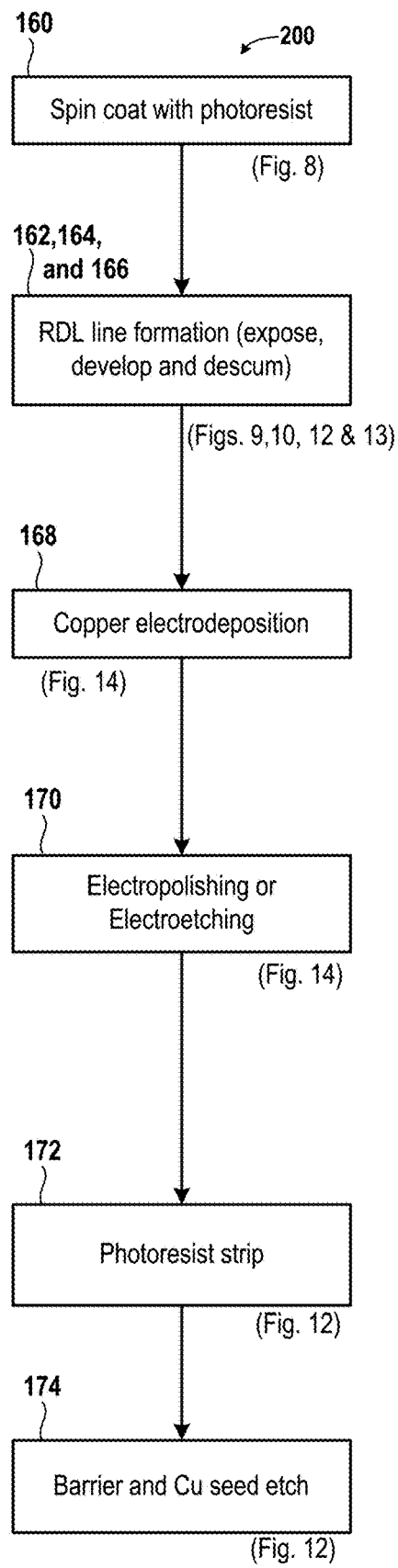
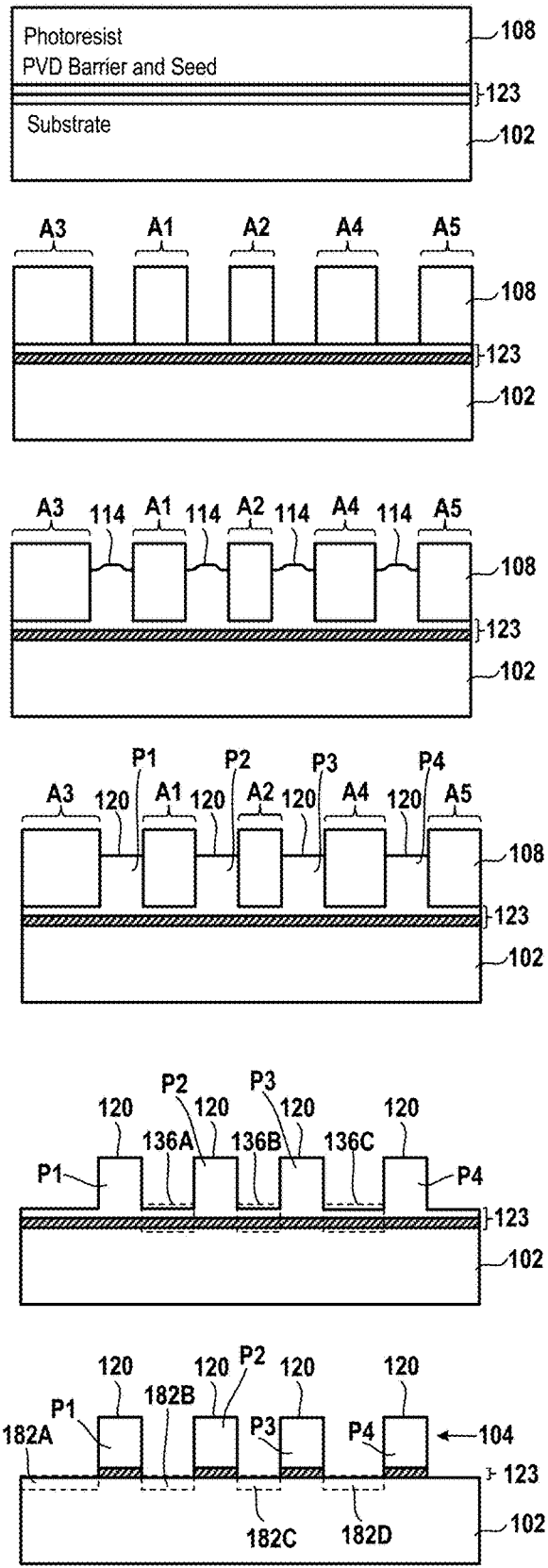
FIG. 2

FIG. 8 (Spinner)

(Patterning/Exposure)

(Developing a Pattern)

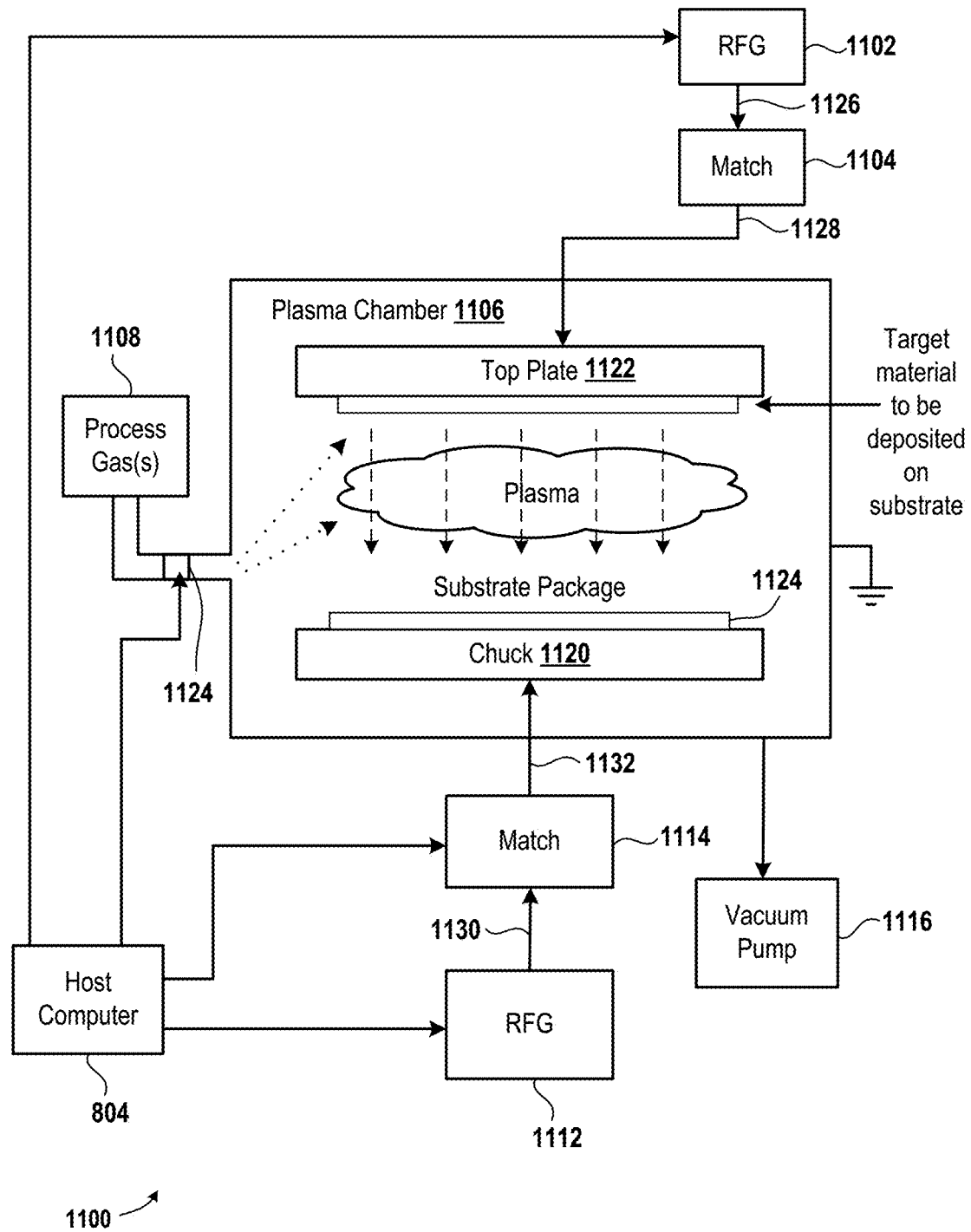
FIG. 11 (PVD)

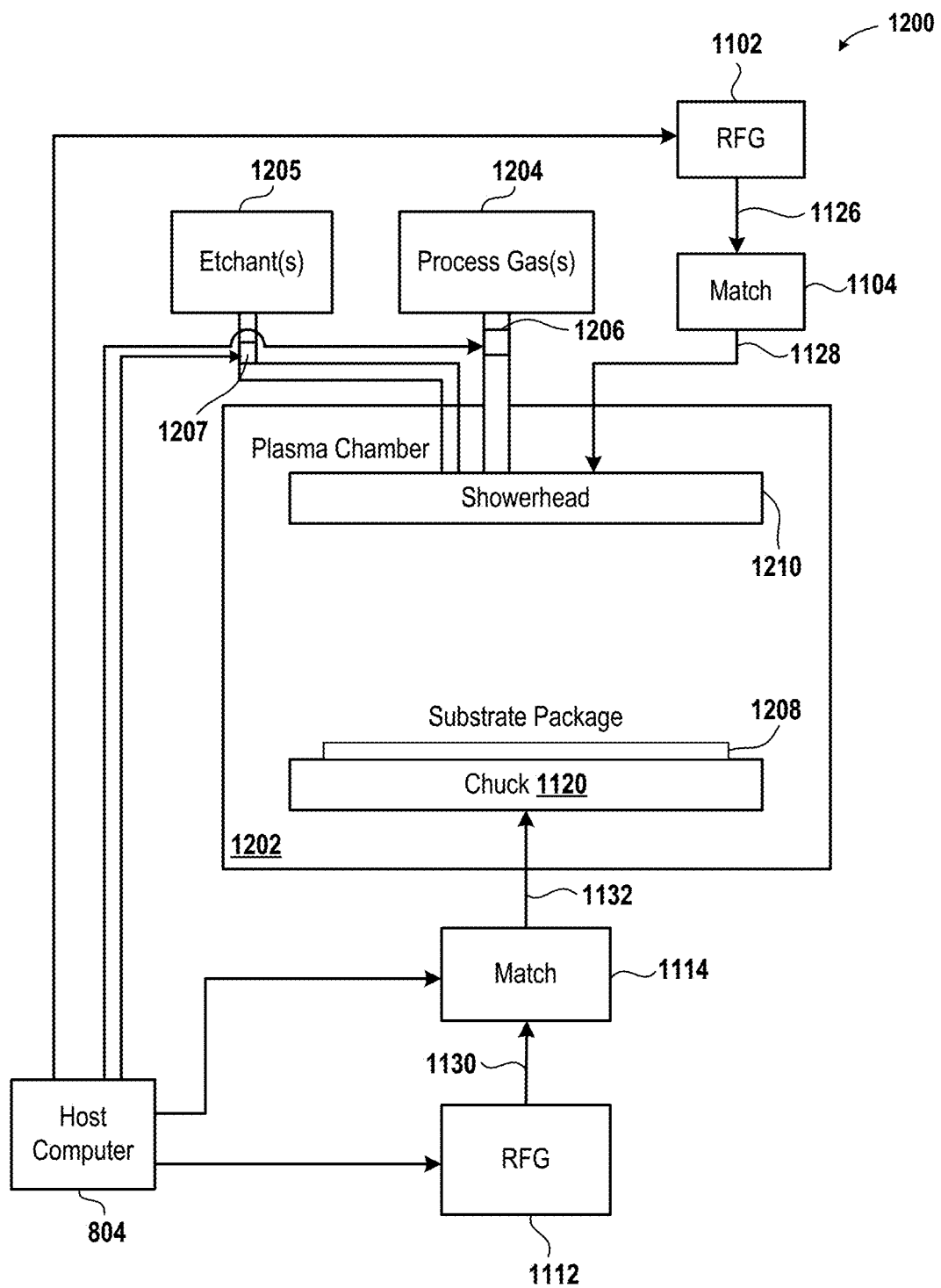
FIG. 12 (Stripping & Etching, Descum)

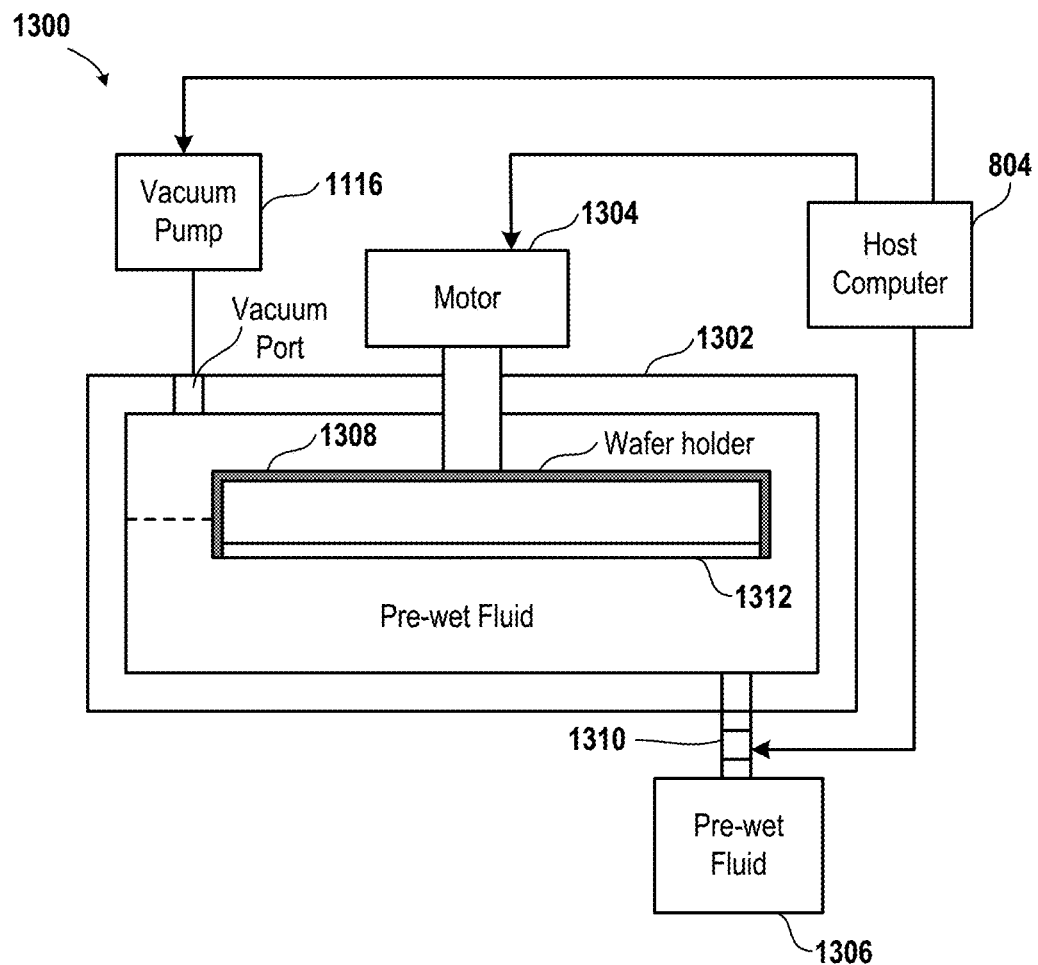
FIG. 13A (Pre-treatment)

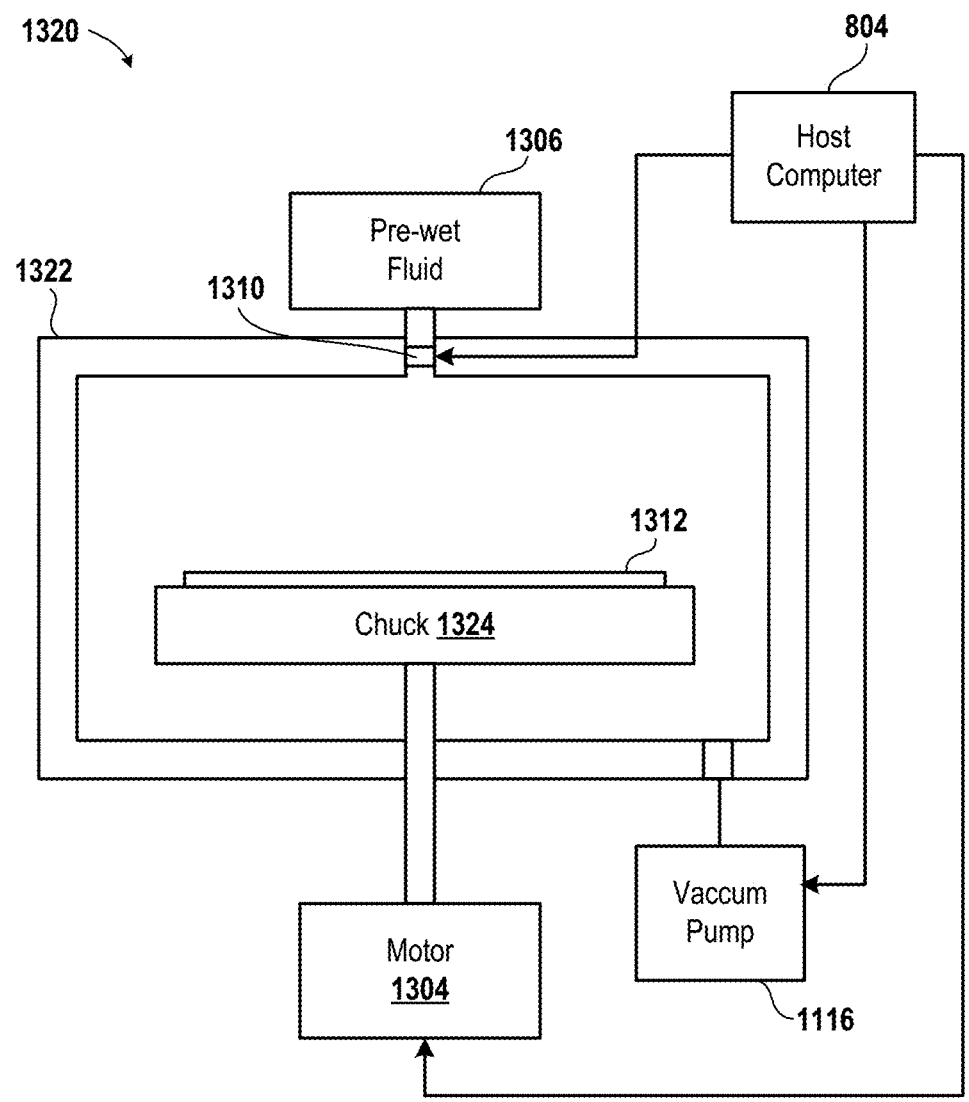
FIG. 13B (Pre-treatment)

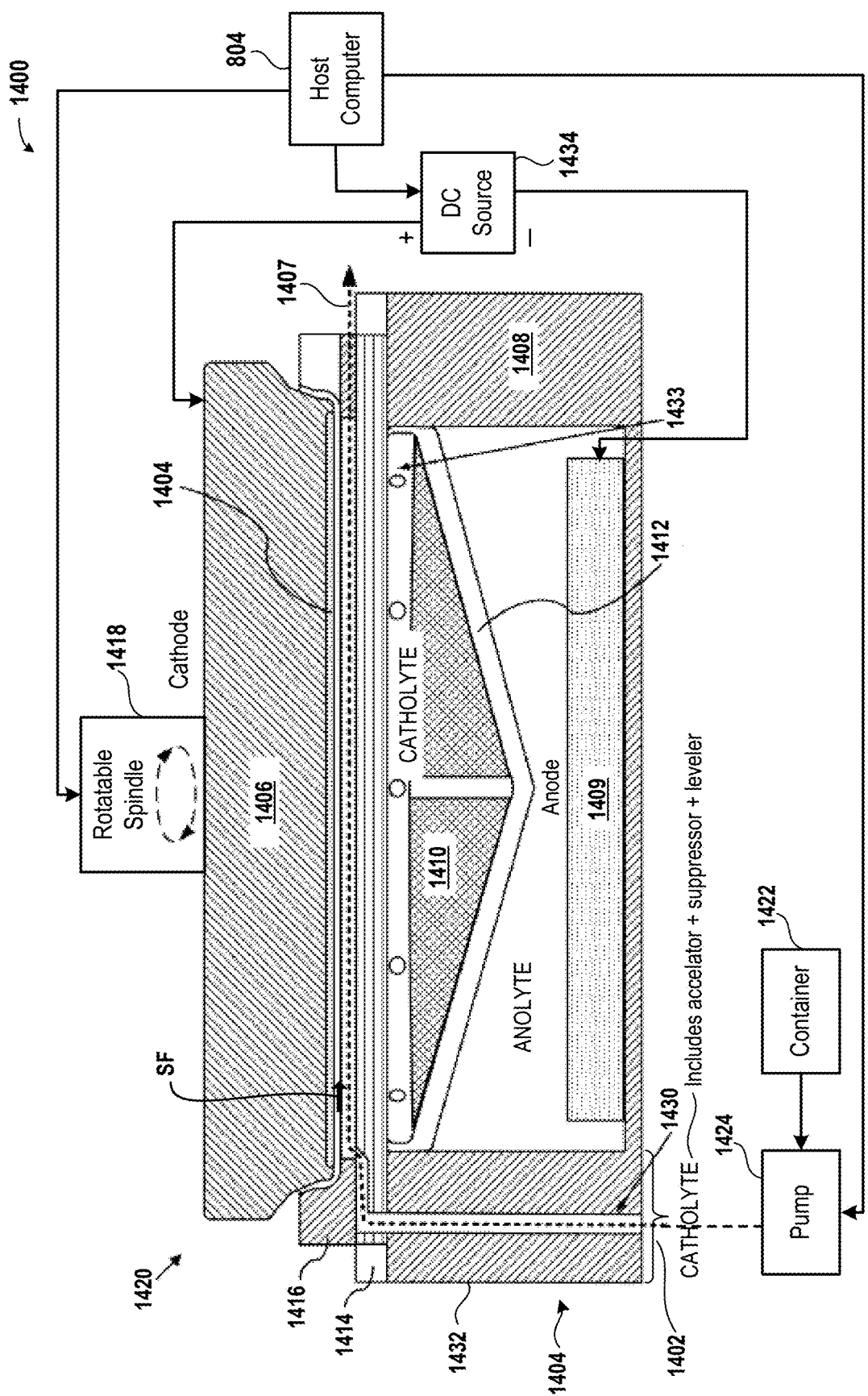
FIG. 14A (Electrodeposition)

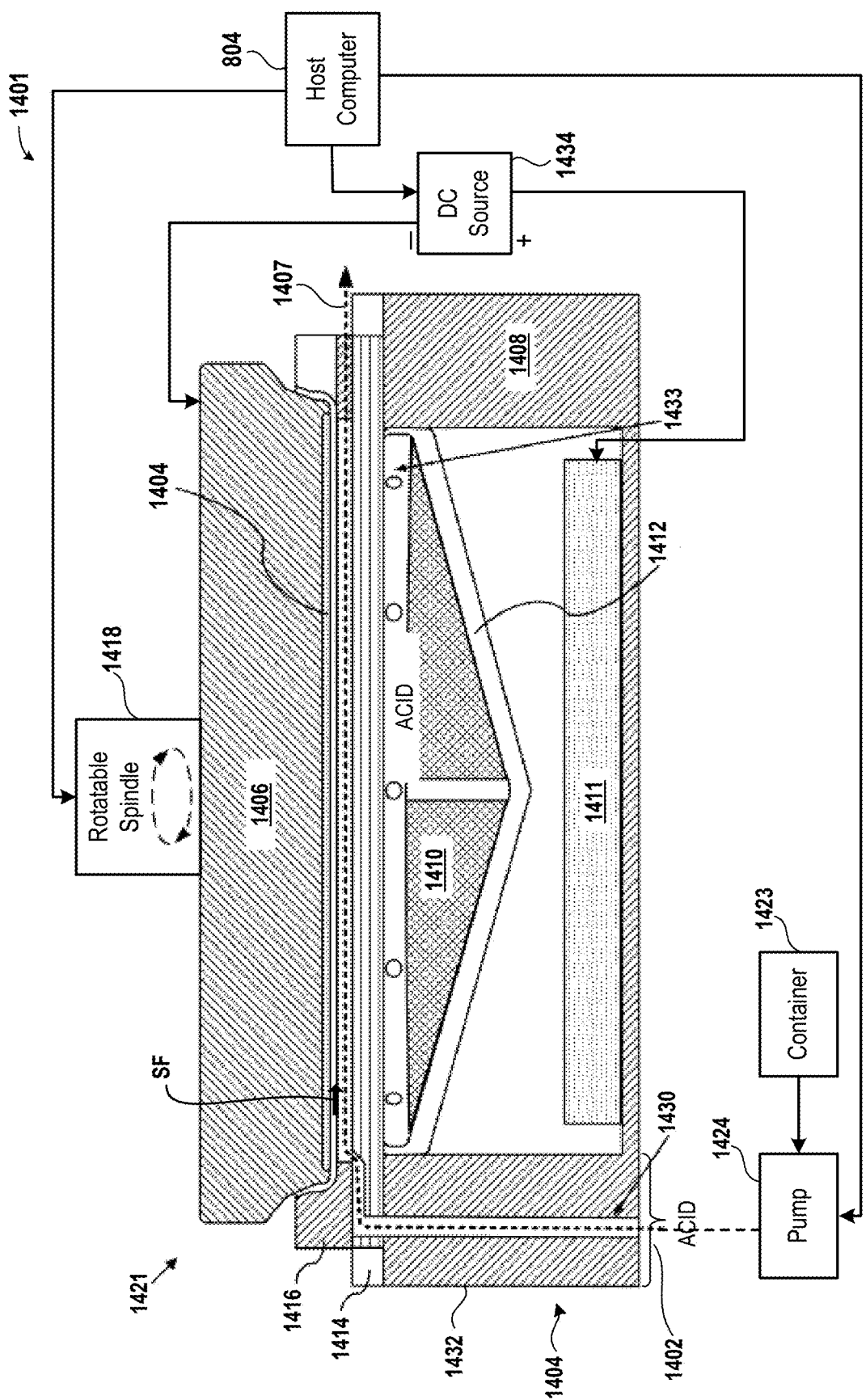
FIG. 14B (Electropolishing)

SYSTEMS AND METHODS FOR ACHIEVING UNIFORMITY ACROSS A REDISTRIBUTION LAYER

CLAIM OF PRIORITY

The present patent application is a continuation-in-part of and claims the benefit of and priority, under 35 U.S.C. § 120, to U.S. patent application Ser. No. 15/161,081, filed on May 20, 2016, and titled "DYNAMIC MODULATION OF CROSS FLOW MANIFOLD DURING ELECTROPLATING", which claims priority, under 35 U.S.C. § 119(e), to a provisional patent Application No. 62/286,246, filed on Jan. 22, 2016, and titled "DYNAMIC MODULATION OF CROSS FLOW MANIFOLD DURING ELECTROPLATING", all of which are incorporated by reference in their entirety.

The application Ser. No. 15/161,081 is a continuation-in-part of and claims the benefit of and priority, under 35 U.S.C. § 120, to U.S. patent application Ser. No. 14/103,395, filed on Dec. 11, 2013, and titled "ENHANCEMENT OF ELECTROLYTE HYDRODYNAMICS FOR EFFICIENT MASS TRANSFER DURING ELECTROPLATING", now issued as U.S. Pat. No. 9,523,155, which is incorporated by reference herein in its entirety.

The application Ser. No. 14/103,395 claims priority, under 35 U.S.C. § 119(e), to a provisional patent Application No. 61/736,499, filed on Dec. 12, 2012, and titled "ENHANCEMENT OF ELECTROLYTE HYDRODYNAMICS FOR EFFICIENT MASS TRANSFER DURING ELECTROPLATING", which is incorporated by reference in its entirety.

FIELD

The present embodiments relate to systems and methods for achieving uniformity across a redistribution layer.

BACKGROUND

Generally, electrochemical deposition processes are used in modern integrated circuit fabrication. Metal line interconnections drive a need for increasingly sophisticated electrodeposition processes and plating tools. Much of the sophistication evolved in response to a need for ever smaller current carrying lines in device metallization layers. These lines are formed by electroplating metal into very thin, high-aspect ratio trenches and vias.

Electrochemical deposition is now poised to fill a commercial need for sophisticated packaging and multichip interconnection technologies known generally and colloquially as wafer level packaging (WLP) and electrical connection technology. These technologies present their own very significant challenges due in part to the generally smaller feature sizes and low aspect ratios.

It is important that with the smaller feature sizes and finer pitches, an amount of electrical conductivity provided by the features is not compromised. It is in this context that embodiments described in the present disclosure arise.

SUMMARY

Embodiments of the disclosure provide systems and methods for achieving uniformity across a redistribution layer. It should be appreciated that the present embodiments can be implemented in numerous ways, e.g., a process, an apparatus, a system, a device, or a method on a computer-readable medium. Several embodiments are described below.

High density fan-out (HDFO) wafer-level packaging (WLP) is a plating technology aimed at improving package performance, shrinking a form factor, and driving down associated costs. HDFO WLP is viewed as an alternative to a significantly more expensive through-silicon-via (TSV) technology. HDFO presents some electroplating applications of interest, such as fine pitch redistribution layer (RDL) and stacking RDLs.

Fan out (FO) technology involves a Semi-Additive-Process (SAP) where RDL lines are formed, copper is plated in a patterned area, and photoresist is stripped and a barrier and seed layer is etched from substrate. Moreover, FO technology includes electrodepositing single layer copper RDLs which vary in line thickness from 10 microns to 100 microns and in spacing between two adjacent lines from 10 microns to 100 microns, while HDFO technology includes electrodepositing copper in much finer pitch RDLs. For example, in HDFO technology, thickness of an RDL lines is 2 microns and spacing between two adjacent RDL lines is 2 microns. As another example, in HDFO technology, thickness of an RDL lines ranges from 2 microns to 10 microns and spacing between two adjacent RDL lines ranges from 2 microns to 10 microns.

During a stacked RDL process, significant topography is created over a wafer surface during the creation of each RDL layer. This variation in topography limits a depth of focus of lithography, which in turn, leads to line size variation across the wafer surface and resolution issues of finer line scaling. Described herein are methods to overcome the issue of the variation of the topography with a two-step process (1) plate the RDL conformally while superfilling a via, such that overgrowth of a conductive material, such as copper or invar ($FeNi_{36}$) or cobalt, is created over the via, followed by (2) electropolishing or electroetching the conductive material so that a planar via-RDL surface is formed.

In some embodiments, the systems and methods for achieving uniformity across the RDL layer include superfilling a via with an RDL structure, e.g., a bump, such that overgrowth over the via is formed. Further, the systems and methods include performing an electropolish or electroetch process to planarize the RDL structure of the RDL layer and/or other RDL regions of the RDL layer to minimize any topographical variation induced by electroplating of the conductive material. In various embodiments, the superfilling and electropolish or electroetch process for the RDL structure and/or the other RDL regions are performed sequentially in the same plating bath to minimize wafer transfers and maximize tool throughput. In some embodiments, the superfilling and electropolish or electroetch process for the RDL structure and/or the other RDL regions is performed sequentially in different plating cells or different plating baths but within the same plating tool platform to simplify a wafer process flow and maximize wafer yields.

In various embodiments, a method for processing a substrate to improve topographic uniformity of a redistribution layer when interfaced with a via is described. The method includes patterning a photoresist layer over the substrate. The patterning defines a region for a conductive line and the via disposed below the region for the conductive line. The conductive line is at a level of the redistribution layer. The method further includes depositing a conductive material in between the patterned photoresist layer, such that the conductive material fills the via and the region for the conductive line. The depositing is further controlled to cause an overgrowth of conductive material of the conductive line to form a bump of the conductive material directly over the via. The conductive material of the conductive line and the bump are maintained to a fill level that is below a top surface of the patterned photoresist layer. The method also includes planarizing a top surface of the conductive line while maintaining the patterned photoresist layer present over the substrate. The planarizing is facilitated by a liquid chemistry that is caused to exert a horizontal shear force over the conductive line and the bump. The planarizing is performed to flatten the bump. The method includes stripping the photoresist after performing the planarizing.

In some embodiments, a method for achieving uniformity of a redistribution layer is described. The method includes depositing an organic dielectric layer on top of a pad located on a substrate, creating a plurality of vias within the dielectric layer to create a plurality of intermediate portions of the dielectric layer, and depositing a barrier and seed layer on top the dielectric layer to form a film on top of the dielectric layer. The film is formed within the vias and on top of the intermediate portions. The method further includes depositing a photoresist on top of the film of the seed layer to fill the vias and to form a layer over the intermediate portions of the dielectric layer. The method includes pattering intermittent areas of the photoresist by removing portions of the photoresist to uncover portions of the film deposited within the vias and additional portions of the film deposited on sections of the intermediate portions of the dielectric layer. The method includes depositing the redistribution layer on top of the portions of the film deposited within the vias and on top of the additional portions of the film such that a height of the redistribution layer is less than a height of the layer of the photoresist. The height of the redistribution layer and the height of the layer of the photoresist are measured from the substrate. The operation of depositing the redistribution layer is performed to overfill the vias. The overfill is performed to create bumps of the redistribution layer. The bumps are created between the intermittent areas of the photoresist. The method includes removing the bumps between the intermittent areas of the photoresist to achieve the uniformity.

Some advantages of the herein described systems and methods for achieving uniformity across the RDL layer, e.g., reducing nonuniformity across the RDL layer, removing nonuniformity across the RDL layer, etc., by performing the electroetching or the electropolishing of the RDL layer that is present between two adjacent areas of a patterned photoresist layer. The areas of the patterned photoresist layer define placement of the RDL layer. Moreover, a high, uniform transverse shear flow of a catholyte from a plating reactor facilitates achieving a uniform electrodeposition of copper of the RDL layer across a surface of the substrate. Likewise, a uniform shear flow of the catholyte improves the uniformity and overall efficiency of the electrodeposition or of an electroetching process.

Additional advantages of the herein described systems and methods include using cobalt or invar or a combination thereof to fabricate the RDL layer. Cobalt and invar have a low thermal expansion, and therefore have a low chance of cracking under high temperatures.

Further advantages of the herein described systems and methods include using a combination of two or more of copper, cobalt, and invar to fabricate the RDL layer. The combination has a low chance of cracking under high temperatures.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2 is a diagram of an embodiment of a method to illustrate a fabrication of the RDL layer over the substrate.

FIG. 11 is a diagram of an embodiment of the system for illustrating a physical vapor deposition (PVD) process.

FIG. 12 is a diagram of an embodiment of a system for performing an operation of photoresist stripping, or a descum operation, or an operation of barrier and seed layer etching.

FIG. 13A is a diagram of an embodiment of a system for performing a pre-treatment operation.

FIG. 13B is a diagram of an embodiment of another system for performing the pre-treatment operation.

FIG. 14A is a diagram of an embodiment of a system for illustrating an electrodeposition operation.

FIG. 14B is a diagram of an embodiment of a system for illustrating an eletropolishing operation.

DETAILED DESCRIPTION

The following embodiments describe systems and methods for achieving uniformity across a redistribution layer. It will be apparent that the present embodiments may be practiced without some or all of these specific details. In other instances, well known process operations have not been described in detail in order not to unnecessarily obscure the present embodiments.

Figure 1A:
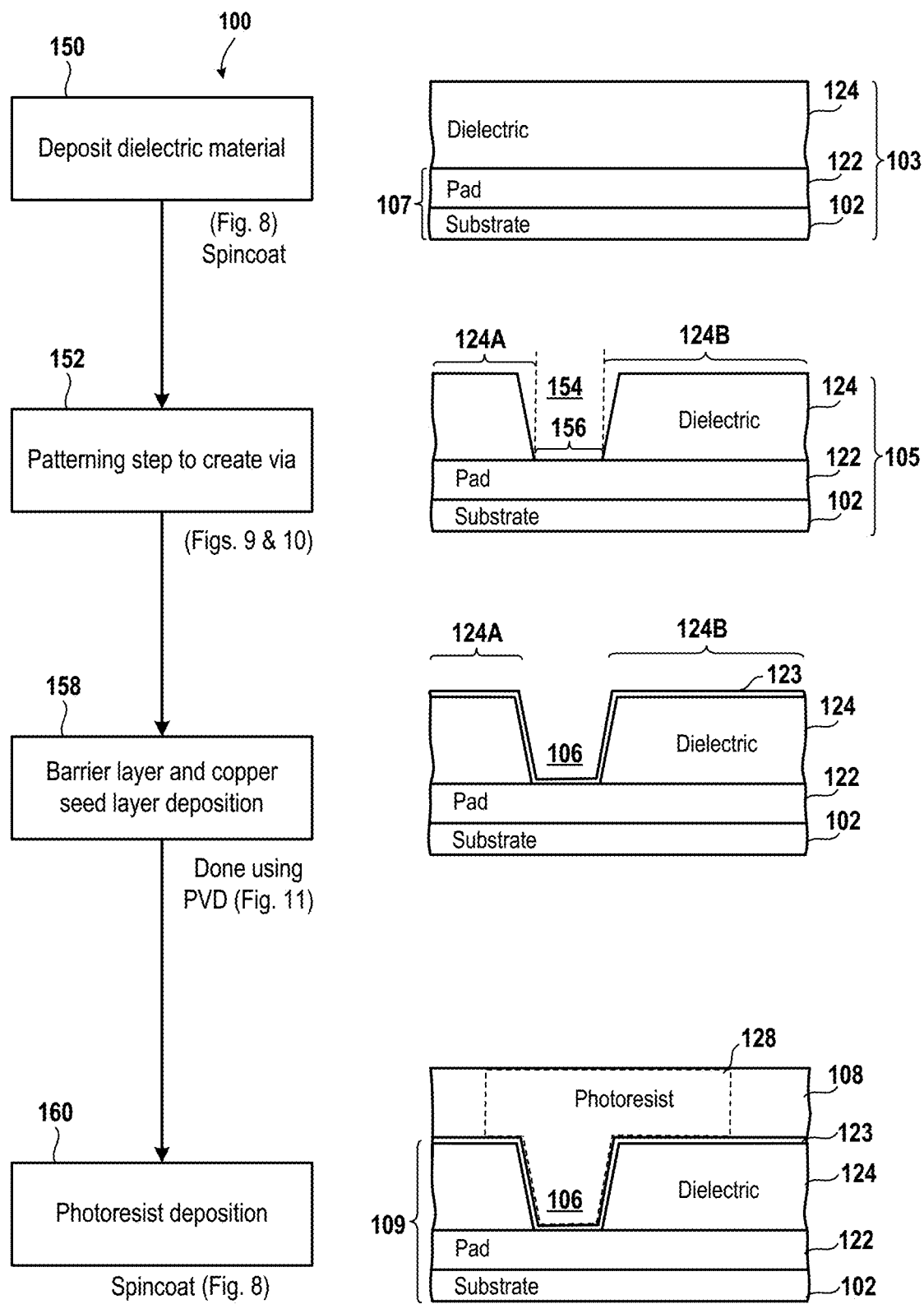
FIG. 1A is a diagram of an embodiment of a method to illustrate fabrication of a redistribution layer (RDL) over a substrate.

FIG. 1A is a diagram of an embodiment of a method 100 to illustrate fabrication of a redistribution layer (RDL) 104 (FIG. 1B) over a substrate 102. The substrate 102 is a thin slice of material, such as, silicon or an alloy of silicon and germanium, etc. The method 100 includes an operation 150 of depositing a layer 124 of a dielectric material, e.g., an organic dielectric material such as polyimide (PI), on top of a pad 122, to form a film of the dielectric material overlaid on the pad 122. An example of the operation 150 is a spincoat process. The operation 150 is performed using a system 800 described below with reference to FIG. 8. The pad 122 is made of a metal, such as, copper, or aluminum, or tungsten, or a combination thereof. The pad 122 is overlaid on top of the substrate 102. In some embodiments, the pad 122 is deposited on the substrate 102 by using the system 800. The pad layer 122 is between the dielectric layer 124 and the substrate 102. It should be noted that in some embodiments, there is no pad 122 between the substrate 102 and the dielectric layer 124. Rather, the dielectric layer 124 is adjacent to the substrate 102.

After depositing the dielectric layer 124 on top of the pad 122, in an operation 152 of the method 100, the dielectric layer 124 is patterned to create multiple vias, such as a via 154, between intermediate portions, such as intermediate portions 124A and 124B, of the dielectric layer 124. The operation 152 is performed using a wafer stepper 900, illustrated in FIG. 9, and an immersive container 1000, illustrated in FIG. 10. The immersive container 1000 is sometimes referred to herein as a wet bench. The vias between the intermediate portions of the dielectric layer 124 are formed to uncover portions, such as a portion 156, of the pad 122.

Furthermore, after the operation 152 of patterning, a thin film of a barrier layer, e.g., a layer of titanium, or a layer of tungsten, or a layer of tantalum, or a layer of a combination of two or more of titanium, tungsten, and tantalum, etc., is deposited on top of the dielectric layer 124. The thin film of the barrier layer is deposited in an operation 158 of the method 100 to cover the intermediate portions 124A and 124B of the dielectric layer 124 and to cover the portion 156 of the pad 122 on top of which the via 154 is patterned. The operation 158 is performed using physical vapor deposition (PVD). The PVD process is described below using a system 1100.

Moreover, a copper seed layer is deposited on top of the barrier layer in the operation 158 to form a thin film of the copper seed layer on top of the barrier layer. For example, the PVD process is repeated again in the operation 158 after depositing the barrier layer to deposit the copper seed layer. The copper seed layer is deposited to cover portions of the barrier layer that cover the intermediate portions 124A and 124B of the dielectric layer 124 and to cover portions of the barrier layer that are overlaid on top of the portion 156 of the pad 122. The copper seed layer and the barrier seed layer are collectively referred to herein as a barrier and seed layer 123. When the barrier and seed layer 123 is deposited on top of the intermediate portions 124A and 124B of the dielectric layer 124 and top of portions, such as the portion 156, of the pad 122, vias, such as a via 106, are formed between the intermediate portions 124A and 124B of the dielectric layer 124. When the via 154 is coated with the barrier and seed layer 123, the via 106 is formed on top of a portion of the barrier and seed layer 123. The portion of the barrier and seed layer 123 is overlaid within the via 106. The entire via 154 is not filled with the barrier and seed layer 123 but a thin film of the barrier and seed layer 123 is formed within the via 154 to create the via 106.

After the operation 158 of depositing the barrier and seed layer 123 is performed, in an operation 160 of the method 100, a photoresist layer 108 is deposited on top of the barrier and seed layer 123. The photoresist layer 108 is deposited by performing the spincoat process. For example, the system 800 is used to overlay the photoresist layer 108 on top of the barrier and seed layer 123. The photoresist layer 108 is deposited to fill the via 106 and to form a thick layer on top of the barrier and seed layer 123, e.g., over the intermediate portions 124A and 124B of the dielectric layer 124. The photoresist layer 108 includes portions, such as a portion 128, which are further described below. The portion 128 extends over a portion of the intermediate portion 124A, over a portion of the intermediate portion 124B, and over the via 106.

It should be noted that a combination of the substrate 102, the pad 122 on top of the substrate 102, and the dielectric layer 124 on top of the pad 122 is referred to herein as a substrate package 103. Moreover, a combination of the substrate 102, the pad 122 on top of the substrate 102, and the adjacent portions 124A and 124B of the dielectric layer 124 on top of the pad 122 and the via 154 on top of the pad 122 is sometimes referred to herein as a substrate package 105. Also, a combination of the substrate 102 and the pad 122 is sometimes referred to herein as a substrate package 107. A combination of the substrate 102, the pad 122, the intermediate portions 124A and 124B, and the barrier and seed layer 123 is sometimes referred to herein as a substrate package 109.

Figure 1B:
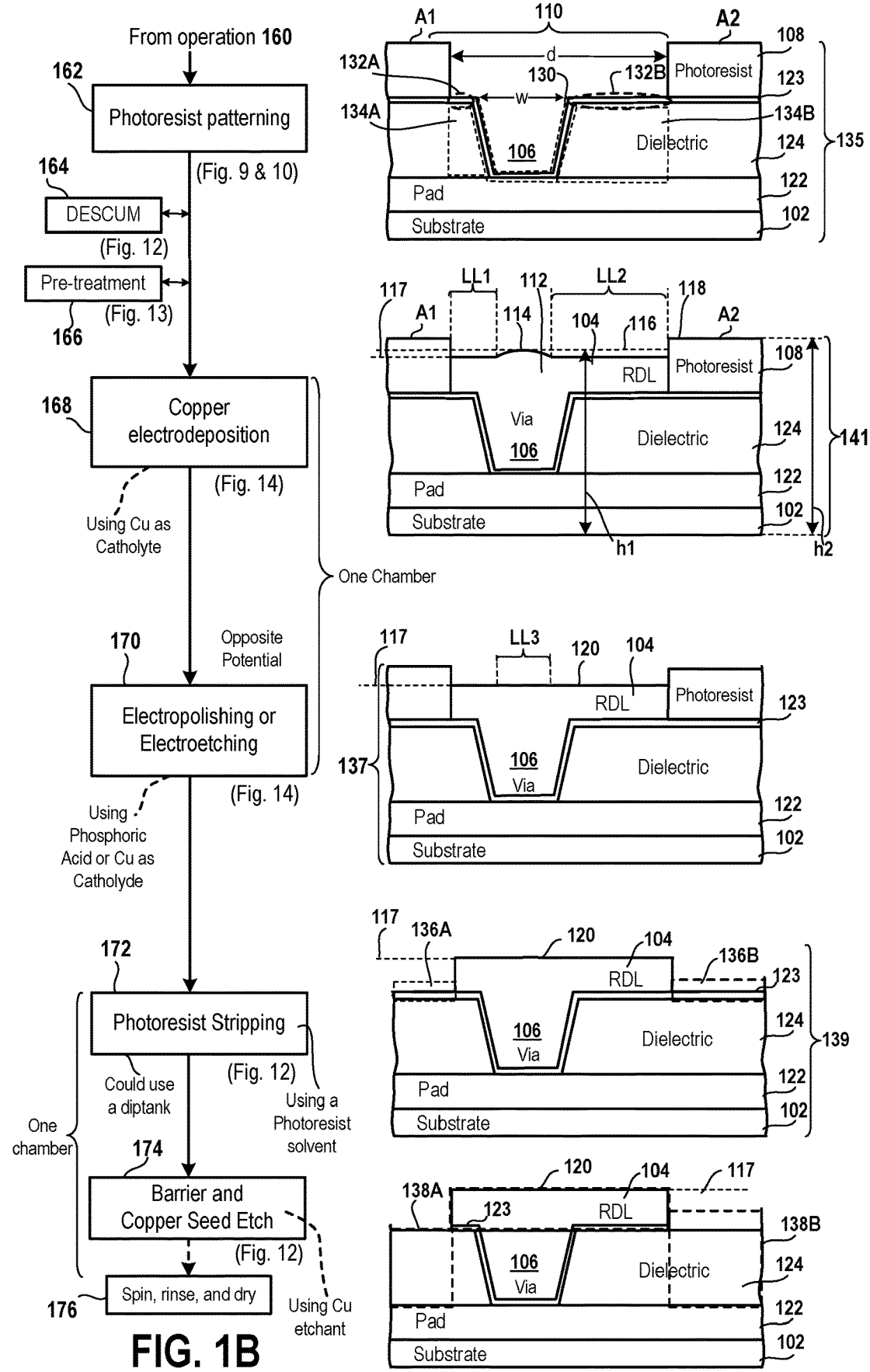
FIG. 1B is a diagram of an embodiment of a continuation of the method illustrating the fabrication of the RDL layer.

FIG. 1B is a diagram of an embodiment of the method 100 for illustrating the fabrication of the RDL layer 104. FIG. 1B is a continuation of the method 100 illustrated in FIG. 1A. After performing the operation 160 of FIG. 1A, an operation 162 of the method 100 is performed. In the operation 162, the photoresist layer 108 (FIG. 1A) is patterned such that adjacent areas, e.g., adjacent areas A1 and A2, of the photoresist layer 108 are formed to create multiple regions, such as a region 110, between the adjacent areas. The region 110 is a space between the areas A1 and A2. The patterning of the photoresist layer 108 is performed using the wafer stepper 900 (FIG. 9) and the immersive container 1000 (FIG. 10). The region 110 is formed between the two adjacent areas A1 and A2 and on top of the via 106. A distance between the two adjacent areas A1 and A2 is represented as d. The distance d is a width of the region 110 and is greater than a maximum width w, e.g., a diameter, etc., of the via 106. The maximum width w of the via 106 is greater than all remaining widths of the via 106. The region 110 is created by removing portions, such as a portion 128 (FIG. 1A), of the photoresist layer 108. The portion 128 is removed to uncover portions 132A and 132B of the barrier and seed layer 123. The portion 132A is deposited on a section 134A of the dielectric layer 124 and the portion 132B is deposited on a section 134B of the dielectric layer 124. Moreover, the portion 128 is removed to uncover an additional portion 130 of the barrier and seed layer 123 that is below the maximum width w of the via 106.

After performing the operation 162, a descum operation 164 of the method 100 is performed. The descum operation 162 is performed to remove any residual photoresist within trenches of the via 106 and to improve wettability of the photoresist areas A1 and A2. The descum operation 164 makes the photoresist less hydrophobic. The descum operation 164 is performed using a system 1200 illustrated in FIG. 12.

After performing the descum operation 164, a pre-treatment operation 166 of the method 100 is performed. An example of the pre-treatment operation 166 is described in U.S. Pat. No. 8,962,085, which is incorporated by reference herein in its entirety. As another example, the pre-treatment operation is a pre-wetting operation performed using a system 1300 of FIG. 13A or a system 1320 of FIG. 13B.

In an operation 168 of the method 100, a conductive material 112, such as copper, or cobalt, or invar, or nickel, or an alloy of nickel and cobalt and iron, or a combination of two or more of copper, cobalt, invar, nickel, the alloy of nickel and cobalt and iron, is deposited within the vias, such as the via 106, and within the regions, such as the region 110, between the adjacent areas A1 and A2 of the photoresist layer 108. An example of the alloy of nickel, cobalt, and iron is F15™ material with matched alpha to borosilicate glass. The operation 168 is performed after the pre-treatment operation 166. It should be noted that in some embodiments, cobalt is impervious to copper seed etchant chemistry, e.g., etchant that is used to etch the copper seed layer, and has approximately 2× higher Young's modulus compared to copper to improve electrical and mechanical performance of the RDL layer 104. The higher Young modulus strengthens the RDL layer 104. Moreover, cobalt has a thermal expansion of 17 parts per million per degree Celsius (ppm/° C.) and copper has a thermal expansion of 13 ppm/° C. Therefore, a high density fan out (HDFO) package that has cobalt as an RDL layer has a lower chance, such as by 30%, of cracking during applications of the HDFO package that include high temperatures. Similarly, invar has a thermal expansion of less than 1 ppm/° C.

A table, provided below, provides properties of copper and cobalt.

TABLE I

| Properties | Cobalt | Copper |
|---|---|---|
| Thermal Expansion | 13.0 ppm/° C. (at 25° C.) | 16.5 ppm/° C. (at 25° C.) |
| Thermal Conductivity | 100 Watts/meter/°K | 401 Watts/meter/°K |
| Electrical Resistivity | 62.4 nΩ · m (at 20° C.) | 16.78 nΩ · m (at 20° C.) |
| Magnetic Ordering | ferromagnetic | diamagetic |
| Young's Modulus | 209 gigapascals (GPa) | 110-128 GPa |
| Shear Modulus | 75 GPa | 48 GPa |
| Bulk Modulus | 180 GPa | 140 GPa |
| Poisson Ratio | 0.31 | 0.34 |
| Mohs Hardness | 5.0 | 3.0 |
| Vickers Hardness | 1043 megapascals (MPa) | 343-369 MPa |
| Brinell Hardness | 470-3000 MPa | 235-878 MPa |

Moreover, a table provided below provides properties of invar.

TABLE II

| Physical Property | Invar Electroplated Film |
|---|---|
| Density (g/cm$^3$) | 8.1 |
| Composition (Wt. %) | 64% Fe, 36% Ni |
| Linear Thermal Expansion ($10^{-6}$, °K$^{-1}$) | 0.4 ± 0.1 |
| Specific Heat Capacity (Joules/gigaKelvin) at 573°K | 0.45 ± 0.05 |
| Thermal Conductivity Watts/meter/°K (W/m. °K) | 43 ± 5 |
| Internal Stress (MPa) | 30 ± 2 |
| Tensile Strength (MPa) | 500 ± 60 |
| Yield Strength (MPa) | 280 ± 50 |
| Ductility (%) | 40 ± 10 |

The operation 168 of electrodeposition is performed using a system 1400 illustrated in FIG. 14A. In some embodiments, the operation 168 is performed using an apparatus described in U.S. Pat. No. 9,523,155, which is incorporated by reference in its entirety. In the operation 168, the vias, such as the via 106, are overfilled with the conductive material 112 to create multiple bumps, such as a bump 114, and to create multiple leveled layers, such as a leveled layer LL1 and a leveled layer LL2. As an example, a diameter of the bump 114 ranges between 180 micrometers to 220 micrometers. To illustrate, a diameter of the bump 114 is 200 micrometers. The conductive material 112 is deposited on top of the portions 132A and 132B of the barrier and seed layer 123 and on top of the portion 130 of the barrier and seed layer 123. Each of the leveled layers LL1 and LL2 are at a level 117. The bump 114 is created over, e.g., directly over, the via 106. For example, a width, e.g., a diameter, a perimeter, etc., of the bump 114 is less than the maximum width w of the via 106. As another example, the bump 114 is concentric with the via 106. As yet another example, the width of the bump 114 is less than the maximum width w of the via 106 and the bump is concentric with the via 106. As another example, the width of the bump 114 is less than the maximum width w of the via 106 and the bump 114 lies within a confinement defined by lines extending vertically from the maximum width w. In some embodiments, a width of the bump 114 is greater than the maximum width w of the via 106. Also, a fill level 116 until which the via 106 and a portion of the RDL layer 104 directly over the via 106 is filled is less than a level 118 of a top surface of the photoresist layer 108. Also, the level 117 is lower than the fill level 116 and the level 118 of the top surface of the photoresist layer 108. The leveled layer LL1 is developed between the bump 114 and the adjacent area A1 of the photoresist layer 108 and the leveled layer LL2 is developed between the bump 114 and the adjacent area A2 of the photoresist layer 108. In some embodiments, a portion of the leveled layer LL1 is created over, e.g., directly over, the via 106 and a portion of the leveled layer LL1 is created over, e.g., directly over, the via 106 with the bump 114 also created directly over the via 106. It should be noted that a height h2 of the areas A1 and A2 of the photoresist layer 108 is greater than a height h1 of the bump 114. The heights h1 and h2 are measured from a bottom surface of the substrate 102. Similarly, the levels 116 through 118 are measured from the bottom surface of the substrate 102. The bump 114 is fabricated between the adjacent areas A1 and A2 of the photoresist layer 108.

Once the operation 168 is performed, in an operation 170 of the method 100, the bumps of the conductive material 112, e.g., the bump 114, is removed in an electropolishing operation 170, which is sometimes referred to herein as an electroetching operation. The electropolishing operation 170 is performed using the system 1400 of FIG. 14B. However, instead of using the conductive material 112 as a catholyte, during the electropolishing operation 170, an acid, such as a phosphoric acid or sulfuric acid, is used to polish the bumps. In some embodiments, the conductive material 112 is used to etch the bumps. The bumps of the conductive material 112 are polished to planarize a top surface 120 of the RDL layer 104. The planarizing of the top surface 120 is performed to form leveled areas, e.g., a leveled area LL3, between the leveled layers LL1 and LL2.

In various embodiments, the planarizing of the top surface 120 is performed to remove or reduce nonuniformities in areas of the RDL layer 104 between the bump 114 and the area A1 or A2 of the photoresist layer 108. In these embodiments, some nonuniformities may remain after the operation 168.

In some embodiments, the level of the leveled areas, e.g., the leveled area LL3, matches a height, measured from the lower surface of the substrate 102, of the leveled layers LL1 and LL2 such that a leveled layer is formed between the adjacent areas A1 and A2. For example, each of the leveled layers LL1, LL2, and LL3 is at the level 117.

After the operation 170, an operation 172 of photoresist stripping of the method 100 is performed. The operation 172 is performed using the system 1200 of FIG. 12. In some embodiments, the operation 172 is performed using an apparatus described in U.S. Pat. No. 7,605,063, which is incorporated by referenced in its entirety. In various embodiments, a diptank is used to perform the operation 172 of photoresist stripping. The photoresist layer 108 having the adjacent areas A1 and A2 are dipped in a photoresist solvent to remove the areas A1 and A2. The photoresist layer 108, e.g., the adjacent areas A1 and A2, are removed or etched during the operation 172. The adjacent areas, such as the adjacent areas A1 and A2, of the photoresist layer 108 are removed to uncover portions, such as portions 136A and 136B, or the barrier and seed layer 123 that surround the RDL layer 104

Upon performing the operation 172, an operation 174 of the method 100 is performed. The operation 174 is performed using the apparatus 1200 of FIG. 12. To illustrate, the copper seed layer is etched away first during the operation 172 to uncover the barrier layer. The copper seed layer is etched away using an etchant, e.g., an acid, a corrosive chemical, a copper etchant, etc. The barrier layer, that is below the copper seed layer, is then etched away to uncover portions, such as portions 138A and 138B, of the dielectric layer 124. The barrier layer is etched away using an etchant, e.g., an acid, a corrosive chemical, etc. During the operation 174, the portions, e.g., the portions 136A and 136B, etc., of the barrier and seed layer 123 are etched away to uncover the portions of the dielectric layer 124. After the operation 174 is performed, conductive lines of the RDL layer 104 remain on top of the via 106. Each conductive line has a leveled top surface. For example, the conductive line of the RDL layer 104 has a planar top surface that lies within a horizontal plane. To illustrate, there is a lack of nonuniformity in the planar top surface of the RDL layer 104 after performing the operation 170 of electropolishing. As another illustration, an amount of uniformity within the RDL layer 104 is less than a pre-determined threshold after performing the operation 170 of electropolishing. As yet another illustration, there are none or minimal nonuniform areas, e.g., roughness, grooves, etc., in which residue or remnants trap themselves thereby reducing conductivity of the RDL layer 104.

In some embodiments, both the operations 172 and 174 are performed in the same chamber, e.g., a single plasma chamber 1202, which is described below with reference to FIG. 12. It should be noted that the portion 138A of the dielectric layer 124 is adjacent to the portion 134A of the dielectric layer 124 and the portion 138B of the dielectric layer 124 is adjacent to the portion 134B of the dielectric layer 124. The portion 134A of the dielectric layer 124 is adjacent to the via 106 and the portion 134B of the dielectric layer 124 is adjacent to the via 106. The portion 134B of the dielectric layer 124 is located on an opposite side of the via 106 compared to the portion 134A of the dielectric layer 124. Similarly, the portion 138A of the dielectric layer 124 is located on an adjacent side of the via 106 compared to the portion 138B of the dielectric layer 124.

In an operation 176, which is performed after the operation 174, a spin, rinse, and dry (SRD) process is performed on the RDL layer 104 and the portions 138A and 138B of the dielectric layer 124. The SRD process occurs in a spin rinse dryer. During the SRD operation, the substrate 102 is rotated on a support to perform the spin operation. Moreover, the rinse operation is performed by allowing a flow of deionized water on top of the RDL layer 104 and the portions 138A and 138B of the dielectric layer 124 for a set period of time, e.g., a minute, two minutes, etc. The deionized water is then blown out from the SRD. During the dry operation, a space within the SRD is heated using heaters to evaporate droplets of the deionized water from the RDL layer 104 and from the portions 138A and 138B of the dielectric layer 124.

It should be noted that a combination of the substrate 102, the pad 122, the patterned dielectric layer 124, the portions 130, 132A and 132B of the barrier and seed layer 123, and the patterned photoresist layer 108 is sometimes referred to herein as a substrate package 135. Furthermore, it should be noted that a combination of the substrate 102, the pad 122, the patterned dielectric layer 124, the areas A1 and A2 of the patterned photoresist layer 108, and the RDL layer 104 having the bumps is sometimes referred to herein as a substrate package 141. Moreover, it should be noted that a combination of the substrate package 102, the pad 122, the patterned dielectric layer 124, the via 106, the RDL layer 104, and the patterned photoresist layer 108 is sometimes referred to herein as a substrate package 137. Also, it should be noted that a combination of the substrate package 102, the pad 122, the patterned dielectric layer 124, the via 106, the RDL layer 104, and the portions 136A and 136B of the barrier and seed layer 123 is sometimes referred to herein as a substrate package 139.

In some embodiments, adjacent areas, described herein, are sometimes referred to herein as proximate regions.

FIG. 2 is a diagram of an embodiment of a method 200 to illustrate a fabrication of the RDL layer 104 over the substrate 102. In the method 200, the operation 160 of depositing the photoresist layer 108 on top of the barrier and seed layer 123 is performed. It should be noted that as illustrated in FIG. 2, there is no dielectric layer 124 and no pad 122 located between the substrate 102 and the photoresist layer 108. Moreover, after the operation 160, the operation 162 of patterning the photoresist layer 108, the descum operation 164, and the pre-treatment operation 166 are performed in the method 200. The operation 162 of patterning the photoresist layer 108 is performed to fabricate the adjacent areas A1, A2, and more adjacent areas A3, A4, and A5. Once the operation 166 is performed, the operation 168 of electrodeposition of the conductive material 112 is performed in the method 200. For example, another bump 114 of the RDL layer 104 is fabricated between the adjacent areas A3 and A1, yet another bump 114 of the RDL layer 104 is fabricated between the adjacent areas A2 and A4, and another bump 114 of the RDL layer 104 is fabricated between the adjacent areas A4 and A5. Also, after the operation 168 is performed, the operation 170 of electropolishing each bump 114 is performed. Each bump 114 is electropolished to form the top surface 120 of the RDL layer 104 to form patterns P1, P2, P3, and P4 of the RDL layer 104. For example, another top surface 120 is formed between the adjacent areas A3 and A1, yet another top surface 120 is formed between the adjacent areas A2 and A4, and another top surface 120 is formed between the adjacent areas A4 and A5.

After the operation 170, the operation 172 of the method 200 is performed. The operation 172 includes stripping patterns, e.g., the adjacent areas A1 through A5, of the photoresist layer 108 is performed. The operation 172 of stripping the adjacent areas A1 through A5 of the photoresist layer 108 is performed until portions 136A and 136B of the barrier and seed layer 123 are uncovered. Moreover, during the operation 172, a portion 136C of the barrier and seed layer 123 is uncovered. It should be noted that the portion 136A is between the two adjacent patterns P1 and P2 of the RDL layer 104, the portion 136B is between the two adjacent patterns P2 and P3 of the RDL layer 104, and the portion 136C is between the two adjacent patterns P3 and P4 of the RDL layer 106.

Once the operation 172 is performed, the operation 174 of the method 200 is performed. During the operation 174, the portions, such as the portions 136A, 136B, and 136C of the barrier and seed layer 123 are etched. When the portions of the barrier and seed layer 123 are etched, portions, such as portions 182A, 182B, 182C, and 182D of the substrate 102 are uncovered. The portion 182B is between the portions P1 and P2 of the RDL layer 104, the portion 182C is between the portions P2 and P3 of the RDL layer 104, and the portion 182D is between the portions P3 and P4 of the RDL layer 104.

Figure 3:
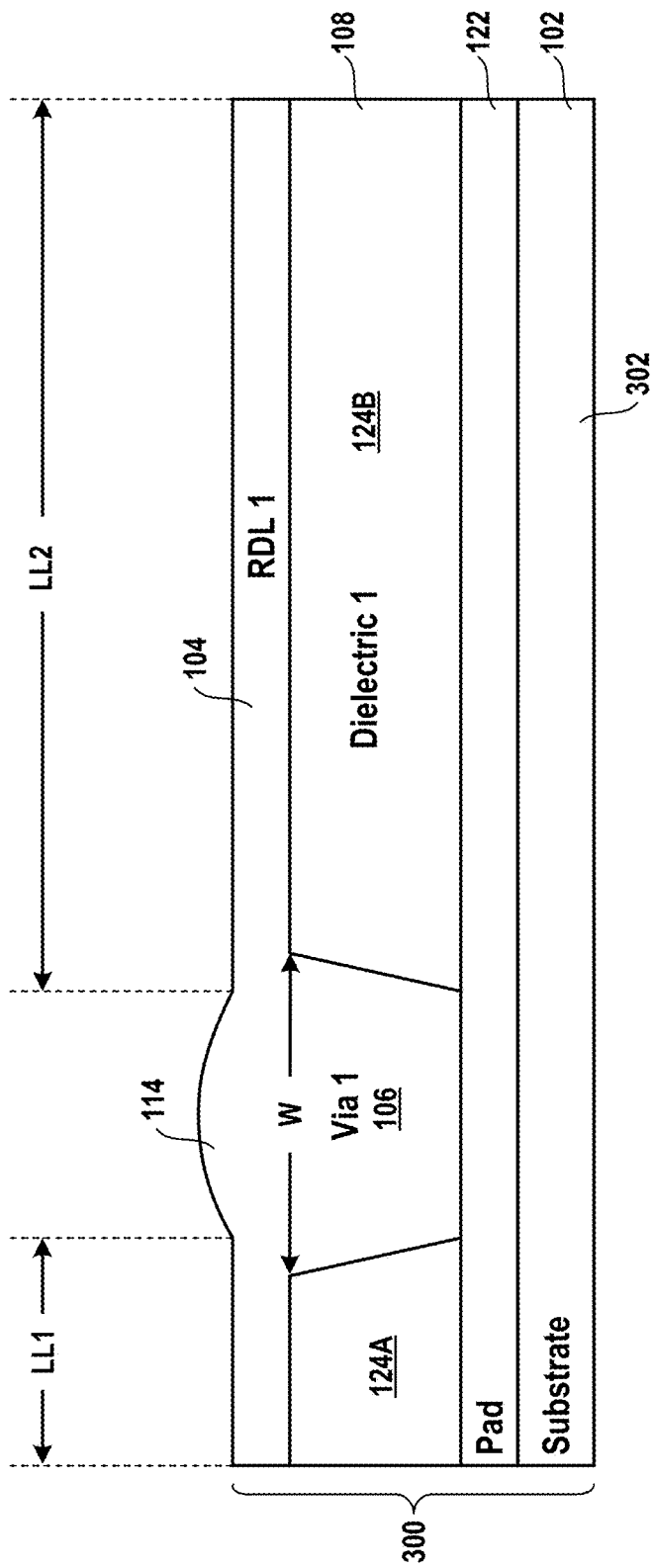
FIG. 3 is a diagram of an embodiment of a substrate package to illustrate an RDL layer that includes bumps.

FIG. 3 is a diagram of an embodiment of a substrate package 300 to illustrate the RDL layer 104 that includes the bumps, such as the bump 114. The substrate package 300 includes the substrate 102 as its bottom layer. The substrate 102 is overlaid with the pad 122 on top of the substrate 102. The dielectric layer 108 is deposited on the pad 122 and is patterned to form the intermediate portions 124A and 124B of the dielectric layer 108 The operation of electrodeposition is performed to overfill the via 106 with the conductive material 112 to form the RDL layer 106 with the bump 114. For example, a diameter of the bump 114 is less than the maximum width w of the via 106 and a height of the bump 114 as measured from a lower surface 302 of the substrate 102 is greater than a height of the via 106 from the lower surface 302. Moreover, a height of the leveled layer LL1 from the lower surface 302 of the substrate 102 is greater than the height of the via 106 and a height of the leveled layer LL2 from the lower surface 302 of the substrate 102 is greater than the height of the via 106.

Figure 4:
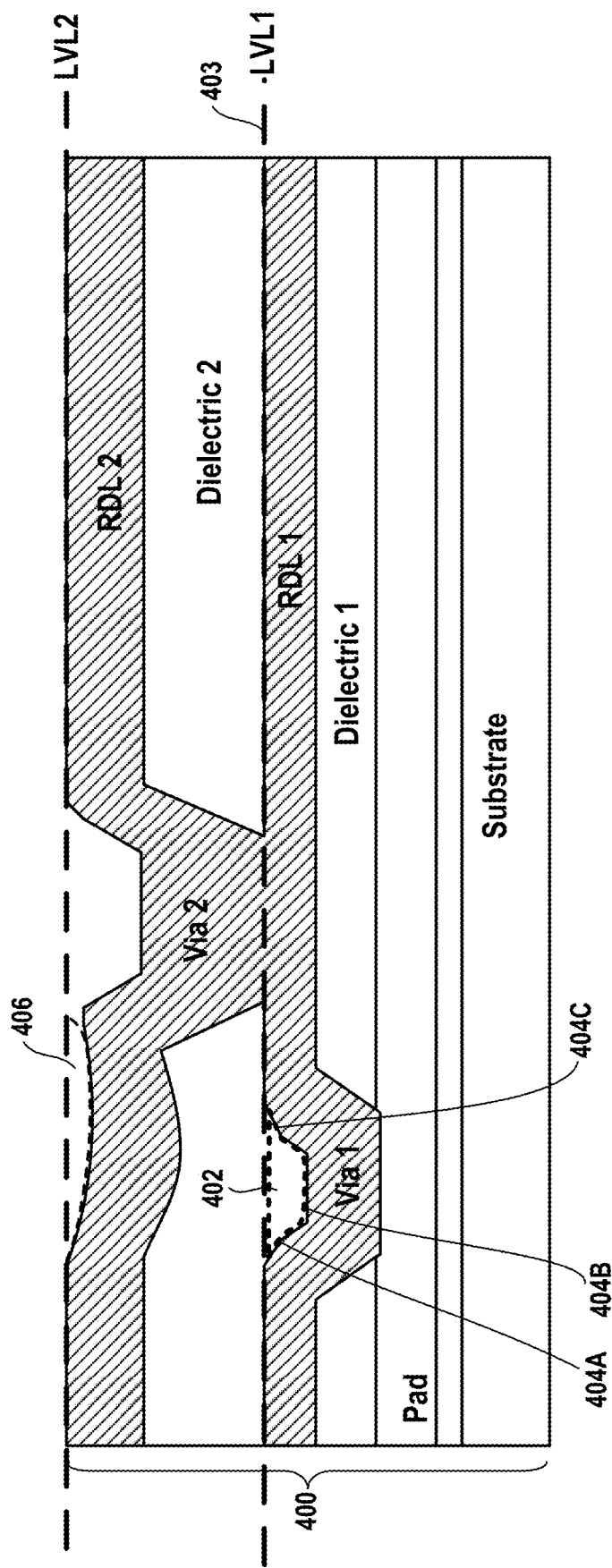
FIG. 4 is a diagram of an embodiment of a substrate package to illustrate nonuniformities in a top RDL layer created by nonuniformities in a bottom RDL layer.

FIG. 4 is a diagram of an embodiment of a substrate package 400 to illustrate nonuniformities in an RDL layer 2 created by nonuniformities in an RDL layer 1. The substrate package 400 includes a substrate. Over the substrate is a pad. On top of the pad is a dielectric layer 1. Over the dielectric layer 1 is an RDL layer 1. There is a nonuniformity 402 within the RDL layer 1. For example, the nonuniformity 402 has multiple surfaces 404A, 404B, and 404C angled with respect to each other. To illustrate, an angle between the surface 404A and 404B is greater than 0 degree or greater than 0.1 degree. As another illustration, an angle between the surface 404B and 404C is greater than 0 degree or greater than 0.1 degree. As another example, the nonuniformity 402 has a curvature and is not straight. Comparatively, in some embodiments, a uniform RDL layer lacks a curvature and is straight, e.g., leveled. As yet another example, a level of the surfaces 404A, 404B, and 404C deviates from a level LVL1 of a top surface 403 of the RDL layer 1.

As a result of the nonuniformity of the RDL layer 1, a dielectric layer 2 that is on top of the RDL layer 1 is nonuniform. Moreover, as a result of the nonuniformity of the dielectric layer 2, another RDL layer 2 that is over the dielectric layer 2 is nonuniform. For example, there is a nonuniformity 406 within the RDL layer 2. The nonuniformity 406 has a curvature. As another example, the nonuniformity 406 deviates from a level LVL2 of the RDL layer 2. The nonuniformity 406 degrades performance of the RDL layer 2. For example, conductivity of the RDL layer 2 decreases. Also, there may be remnant materials of a process, described herein, e.g., SRD process, etc., deposited within the nonuniformity 406 to degrade the performance.

Figure 5:
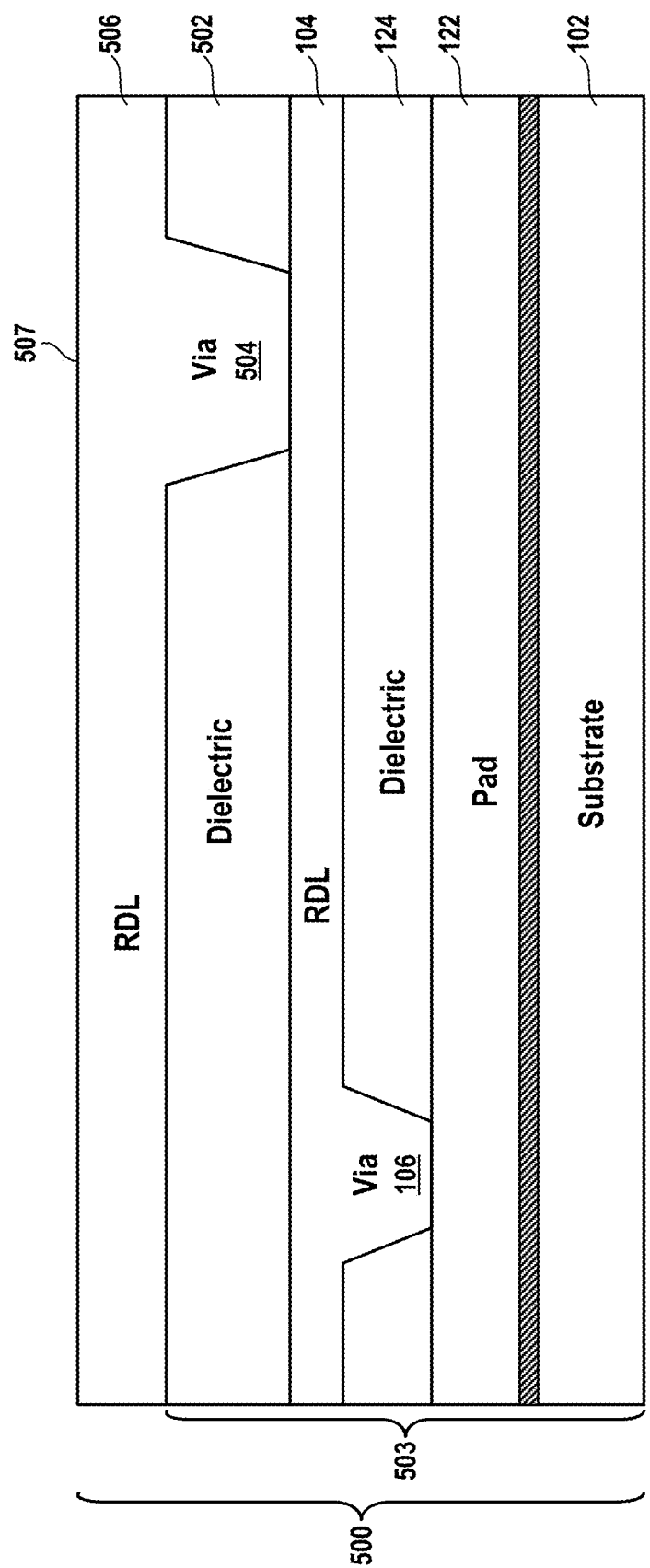
FIG. 5 is a diagram of an embodiment of a substrate package to illustrate an RDL layer that has minimal or zero nonuniformities on its top surface.

FIG. 5 is a diagram of an embodiment of a substrate package 500 to illustrate an RDL layer 506 that has minimal, e.g., within the pre-determined threshold, etc., or zero nonuniformities on its top surface. The substrate package 500 includes the substrate 102 and the pad 122 deposited over the substrate 102. In some embodiments, there is a layer, e.g., a dielectric layer, between the pad 122 and the substrate 102.

The package 500 further includes the dielectric layer 124 deposited on top of the pad 122 and the RDL layer 104 deposited over the dielectric layer 124. Another dielectric layer 502 of the package 500 is deposited on top of the RDL layer 104. For example, the operation 150 (FIG. 1A) of depositing the dielectric material on the RDL layer 104 is repeated to deposit the dielectric layer 502. Moreover, the dielectric layer 502 is patterned by repeating the operation 152 to create vias, such as a via 504, within the dielectric layer 502. Furthermore, the operation 158 (FIG. 1A) is repeated to deposit a thin film of a barrier and seed layer on top of the dielectric layer 502. Also, a photoresist layer is deposited on the barrier and seed layer deposited on top of the dielectric layer 502 by repeating the operation 160 of FIG. 1A. The photoresist layer deposited on the barrier and seed layer is then patterned by repeating the operation 162 of FIG. 1B. The patterning is created to create additional adjacent areas, such as the adjacent areas A1 and A2 (FIG. 1B), of the photoresist layer deposited over the dielectric layer 502. Moreover, a distance between the additional adjacent areas of the photoresist layer deposited over the dielectric layer 502 is greater than a maximum width of the via 504.

Furthermore, the operations 164 and 166 of FIG. 1B are repeated to be performed on the patterned photoresist layer. Then, the operation 168 (FIG. 1B) of electrodeposition of the conductive material 112 is performed on the barrier and seed layer deposited on the dielectric layer 502 and between the additional adjacent areas of the patterned photoresist layer deposited over the dielectric layer 502 to fabricate bumps, such as the bump 114 (FIG. 1B), of the conductive material 112 and to create leveled layers, such as the leveled layers LL1 and LL2 (FIG. 1B), of the RDL layer 506. The bumps are fabricated directly over the vias, such as the via 504.

Thereafter, the operation 170 of electropolishing is performed to remove the bumps of the conductive material 112 to further create a leveled surface, similar to the top surface 120 having the leveled layers LL1, LL2, and LL3, of the RDL layer 506. For example, the operation 170 applies the shear horizontal force to remove a bump, similar to the bump 114 (FIG. 1B), of the conductive material 112 to further create a planar surface between two of the additional adjacent areas. The horizontal shear force is parallel to a top surface 507 of the RDL 506 and is applied between the bump and the two additional adjacent areas. After the bumps of the RDL layer 506 are removed, the patterned photoresist is then striped using the operation 172 of FIG. 1B. Moreover, the barrier and seed layer is etched using the operation 174 of FIG. 1B to form the RDL layer 504. The RDL layer 504 is on top of the barrier and seed layer and over the dielectric layer 502. Then the operation 176 (FIG. 1B) of SRD is performed on the substrate package 500.

It should be noted that the RDL layer 104 does not have any or has a minimal amount of nonuniformities. The RDL layer 506, therefore, also does not have any or has a minimal amount of nonuniformities. It should further be noted that a combination of the pad 122 over the substrate 102, the dielectric layer 124 on top of the pad 124, the RDL 104 over the dielectric layer 124, and the dielectric layer 502 on top of the RDL 104 is sometimes referred to herein as a substrate package 503.

In various embodiments, the RDL layer 104 is fabricated from copper and the RDL layer 506 is fabricated from cobalt or invar. This is because etchant of the copper seed layer deposited on top of the patterned dielectric layer 502 has less of an effect on mechanical integrity of the RDL layer 506 fabricated from cobalt of invar.

Figure 6:
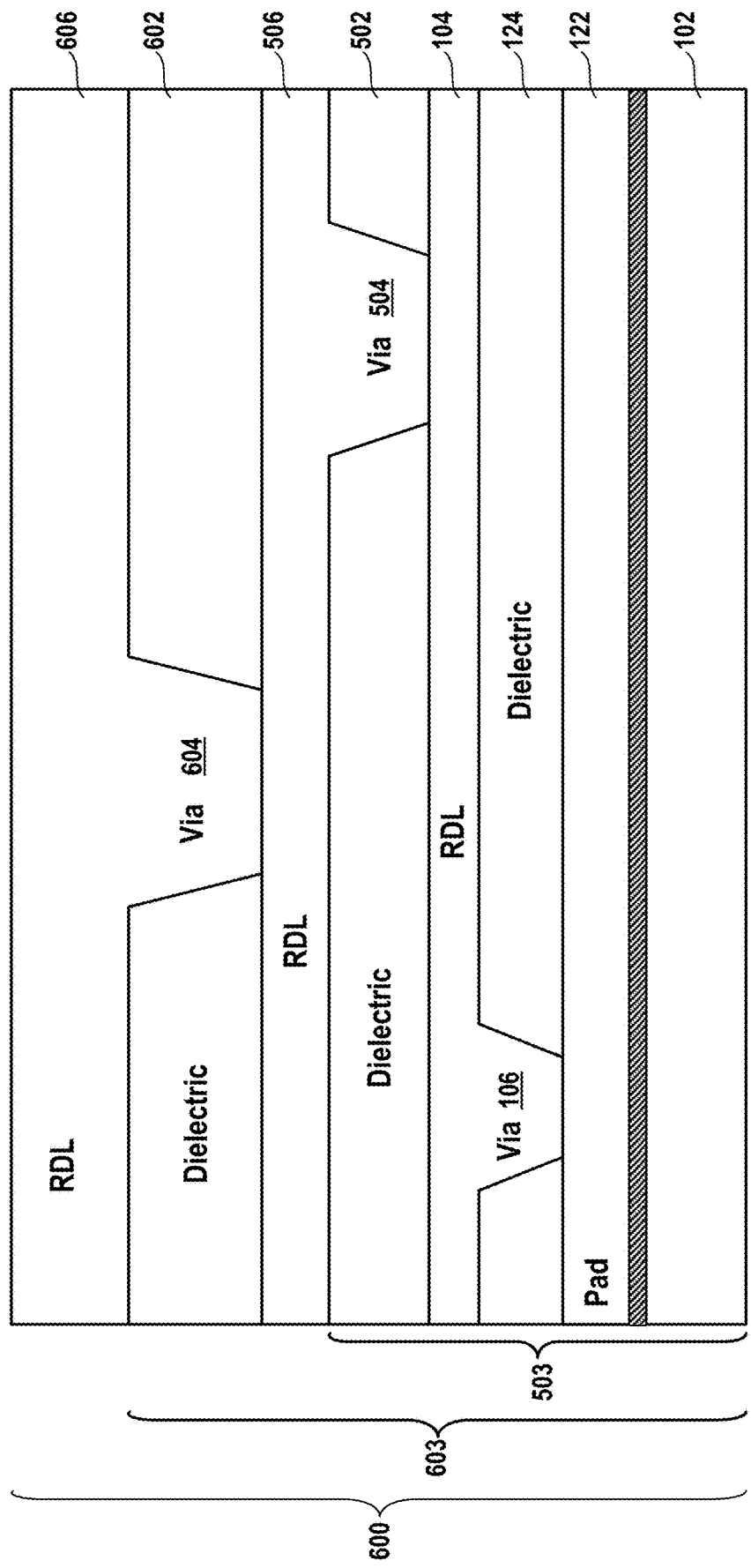
FIG. 6 is a diagram of an embodiment of a substrate package to illustrate deposition of multiple RDL layers over a substrate.

FIG. 6 is a diagram of an embodiment of a substrate package 600 to illustrate deposition of multiple RDL layers. The substrate package 600 includes the layers of the substrate package 500 (FIG. 5). Moreover, on top of the RDL layer 506, a dielectric layer 602 of the substrate package 600 is deposited by using the operation 150 of FIG. 1A. Furthermore, after depositing the dielectric layer 602, the dielectric layer 602 is patterned by performing the operation 152 (FIG. 1A). After the dielectric layer 602 is patterned, a barrier and seed layer is deposited on top of the patterned dielectric layer 602 by performing the operation 158 (FIG. 1A). Thereafter, a photoresist layer is deposited on the barrier and seed layer deposited on top of the patterned dielectric layer 602 by performing the operation 160 (FIG. 1A). The photoresist layer is then patterned by performing the operation 162 (FIG. 1B), followed by the descum operation 164 (FIG. 1B) and the pre-treatment operation 166 (FIG. 1B). Then, the conductive material 112 is deposited between portions of the patterned, descummed, and pre-treated photoresist layer to form bumps, such as the bump 114 (FIG. 1B), of the conductive material 112 and to create leveled areas, such as the leveled layers LL1 and LL2 (FIG. 1B), of the conductive material 112. For example, a bump and the leveled areas are created between two adjacent areas of the patterned, descummed, and pre-treated photoresist layer. The operation 170 (FIG. 1B) of electropolishing the bumps is then performed to create a leveled surface, similar to the top surface 120, of an RDL layer 606 that is formed over the dielectric layer 602 and on top of the barrier and seed layer. For example, a horizontal shear force is applied to remove the bump between the adjacent areas of the patterned, descummed, and pre-treated photoresist layer. Once the electropolishing operation 170 is performed, the operation 172 (FIG. 1B) of stripping the patterned, descummed, and pre-treated photoresist layer is performed. Portions of the barrier and seed layer on top of the dielectric layer 602 are etched by performing the operation 174 (FIG. 1B). Then the operation 176 (FIG. 1B) of SRD is performed on the substrate package 600.

It should be noted that the RDL layer 506 does not have any or has a minimal amount of nonuniformities. The RDL layer 606, therefore, also does not have any or has a minimal amount of nonuniformities. It should further be noted that a combination of the substrate package 503, the RDL 506 over the dielectric layer 502 and the dielectric layer 602 on top of the RDL 506 is sometimes referred to herein as a substrate package 603.

In some embodiments, any number of RDL layers, e.g., four, five, six, etc., are deposited over the substrate 102, in a similar manner in which the RDL layers 506 and 606 are formed over the substrate 102.

In various embodiments, the RDL layer 104 is fabricated from cobalt, the RDL layer 506 is fabricated from invar, and the RDL layer 606 is also fabricated from invar. This is because a high conductivity of cobalt results creates a low resistance in the RDL layer 506 and use of invar minimizes any coefficient of thermal expansion (CTE) effects.

In some embodiments, the RDL layer 104 is fabricated from copper, the RDL layer 506 is fabricated from invar, and the RDL layer 606 is also fabricated from invar. This is because a high conductivity of copper results in a low resistivity of the RDL layer 104 and use of invar minimizes any coefficient of thermal expansion (CTE) effects.

In various embodiments, the RDL layer 104 is fabricated from any of the conductive materials, e.g., the conductive material 112, described above, the RDL layer 506 is fabricated from any of the conductive materials, e.g., the conductive material 112, described above, and the RDL layer 606 is fabricated from any of the conductive materials, e.g., the conductive material 112, described above. For example, the RDL layer 104 is fabricated from nickel, the RDL layer 506 is fabricated from invar, and the RDL layer 606 is fabricated from an alloy of nickel and cobalt and iron. As another example, the RDL layer 104 is fabricated from an alloy of nickel and cobalt and iron, the RDL layer 506 is fabricated from cobalt, and the RDL layer 606 is fabricated from invar.

Figure 7:
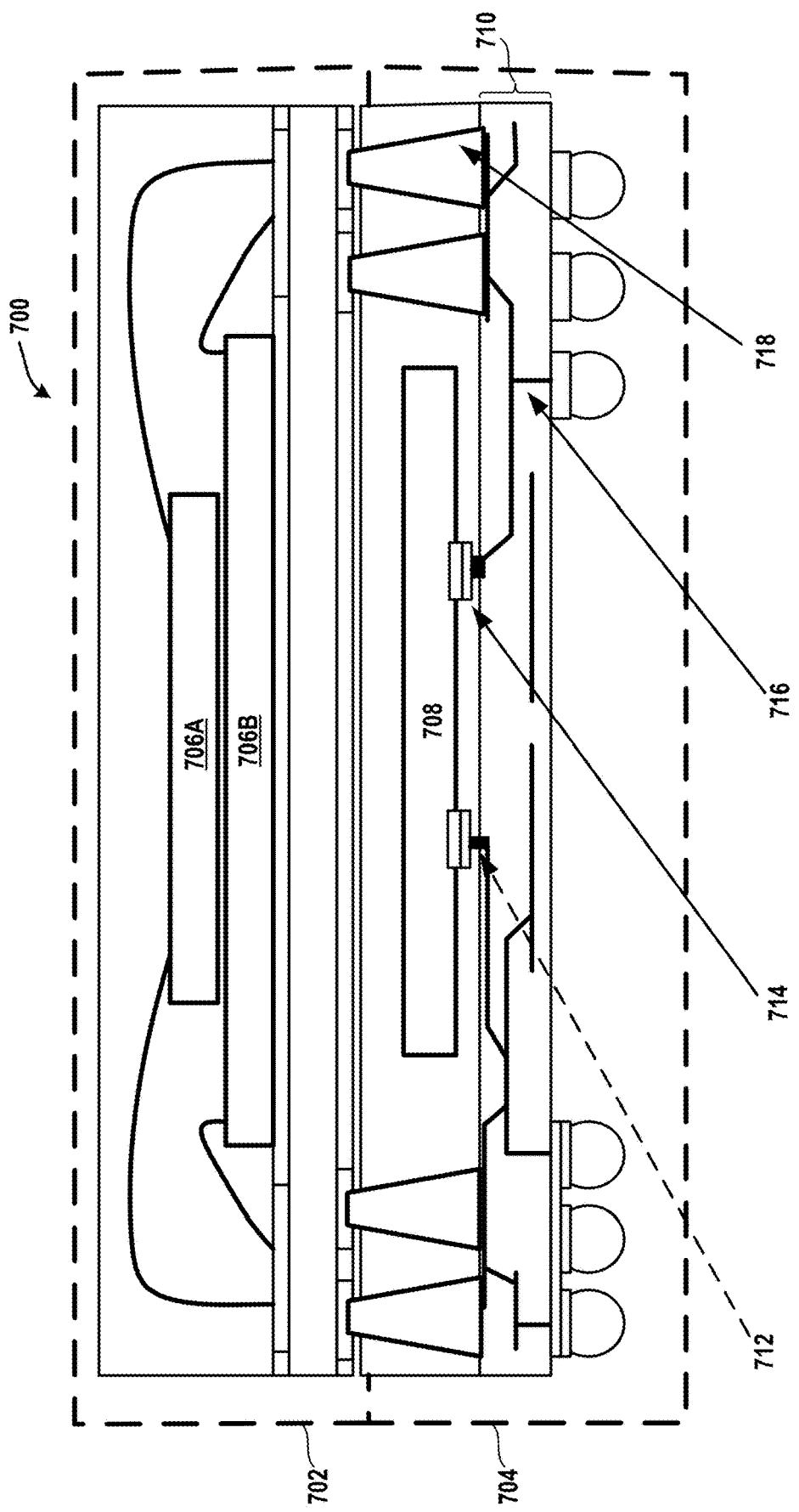
FIG. 7 is a diagram of an embodiment of an integrated circuit stack to illustrate a use of an RDL layer.

FIG. 7 is a diagram of an embodiment of an integrated circuit stack 700. The integrated circuit stack 700 is a high density fan out (HDFO) package that has multi-die systems. In some embodiments, a thickness of the HDFO package ranges between 0.8 millimeters and 0.1 millimeters. For example, a height of the HDFO package is 0.9 millimeters. The integrated circuit stack 700 has benefits, such as, a lower height compared to a through-silicon-via (TSV) integrated circuit stack, improved thermal performance compared to the TSV integrated circuit stack, consumption of lower power than the TSV integrated circuit stack, a higher bandwidth memory compared to the TSV integrated circuit stack, and a simplified supply chain compared to the TSV integrated circuit stack.

The integrated circuit stack 700 includes a top integrated circuit (IC) package 702, such as a memory circuit package, and a bottom IC package 704, such as a logic circuit package. In some embodiments, both the top and bottom IC packages are memory circuit packages or logic circuit packages.

The top IC package 702 includes a system-on-chip (SoC) 706A that is placed on top of another SoC 706B. In some embodiments, the top IC package 702 has a single SoC or multiple SoCs stacked on top of each other. The bottom IC package 704 has an SoC 708. In some embodiments, the bottom IC package 704 has multiple SoCs stacked on top of each other.

A substrate package 710 of the bottom IC package 704 is coupled to the SoC 708 via one or more under bump metallizations (UBMs), such as a UBM 712, and one or more pillars, e.g., a pillar 714. Sometimes, a pillar is referred to herein as a microbump. The substrate package 500 (FIG. 5) is an example of the substrate package 710. In some embodiments, instead of the substrate package 500, the substrate package 600 (FIG. 6) or another substrate package with multiple RDLs is used in the integrated circuit stack 700.

Moreover, the SoC 708 is coupled to the top IC package 702 via an RDL 716 and one or more megapillars, e.g., a megapillar 718. A component, e.g., a memory device, a memory controller, a processor, a logic circuit, etc., of the SOC 708 communicates with another component, e.g., a memory device, a memory controller, a processor, a logic circuit, etc., of the top IC package 702 via the RDL 716 and the one or more megapillars.

In some embodiments, the one or more UBMs are fabricated from copper, or nickel, or gold, or a combination of two or more of copper, nickel, and gold, e.g., CuNiAu. Moreover, in various embodiments, each UBM has a thickness, e.g., a diameter, ranging from 3 microns to 5 microns. For example, the UBM 712 has a thickness of 3 microns. As another example, the UBM 712 has a thickness of 5 microns. In some embodiments, each UBM has a critical dimension (CD) ranging from 190 microns to 240 microns. For example, each UBM has a CD of 190 microns. As another example, each UBM has a CD of 210 microns. In various embodiments, each UBM has a nonuniformity that is between 8% and 12%. For example, each UBM has a nonuniformity that is 10%.

In various embodiments, the one or more pillars, e.g., microbumps, are fabricated from copper, or nickel, or silver, or stannum, or a combination of two or more of copper, nickel, stannum, and silver, e.g., Cu(Ni)SnAg. Moreover, in some embodiments, each pillar has a thickness ranging from 25 microns to 40 microns. For example, the pillar 714 has a thickness of 25 microns. As another example, the pillar 714 has a thickness of 40 microns. In several embodiments, each pillar has a CD ranging from 25 microns to 90 microns. For example, each pillar has a CD of 25 microns. As another example, each pillar has a CD of 90 microns. As yet another example, some pillars have a CD of 25 microns and remaining pillars have a CD of 90 microns. In some embodiments, each pillar has a nonuniformity that is between 8% and 12%. For example, each pillar has a nonuniformity that is 10%.

In various embodiments, the RDL 716 is fabricated from the conductive material 112. Moreover, in some embodiments, the RDL 716 has a thickness ranging from 0.75 microns to 3 microns. For example, the RDL 716 has a thickness of 1 micron. As another example, the RDL 716 has a thickness of 2 microns. In several embodiments, the RDL 716 has a CD ranging from 3 microns to 5 microns. For example, the RDL 716 has a CD of 3 microns. As another example, the RDL 716 has a CD of 5 microns. In some embodiments, a distance between two adjacent RDLs, e.g., RDLs at the same level, ranges from 0.75 microns to 3 microns. For example, a distance or spacing between two adjacent RDLs at the same level is 2 microns. As another example, a distance or spacing between two adjacent RDLs at the same level is 1 micron. In various embodiments, the RDL 716 has a nonuniformity that is between 4% and 12%. For example, the RDL 716 has a nonuniformity that is 4%. As another example, the RDL 716 has a nonuniformity that is 10%, e.g., 10 percent of a top surface of the RDL 716 has nonuniformity.

In some embodiments, the one or more megapillars are fabricated from the conductive material 112. Moreover, in some embodiments, the one or more megapillars has a thickness ranging from 150 microns to 200 microns. For example, the megapillar 718 has a thickness of 150 microns. As another example, the megapillar 718 has a thickness of 200 microns. In several embodiments, the megapillar 718 has a CD ranging from 100 microns to 200 microns. For example, the megapillar 718 has a CD of 100 microns. As another example, the megapillar 718 has a CD of 200 microns. In various embodiments, the megapillar 718 has a nonuniformity that is between 5% and 10%. For example, the megapillar 718 has a nonuniformity that is 5%.

Figure 8:
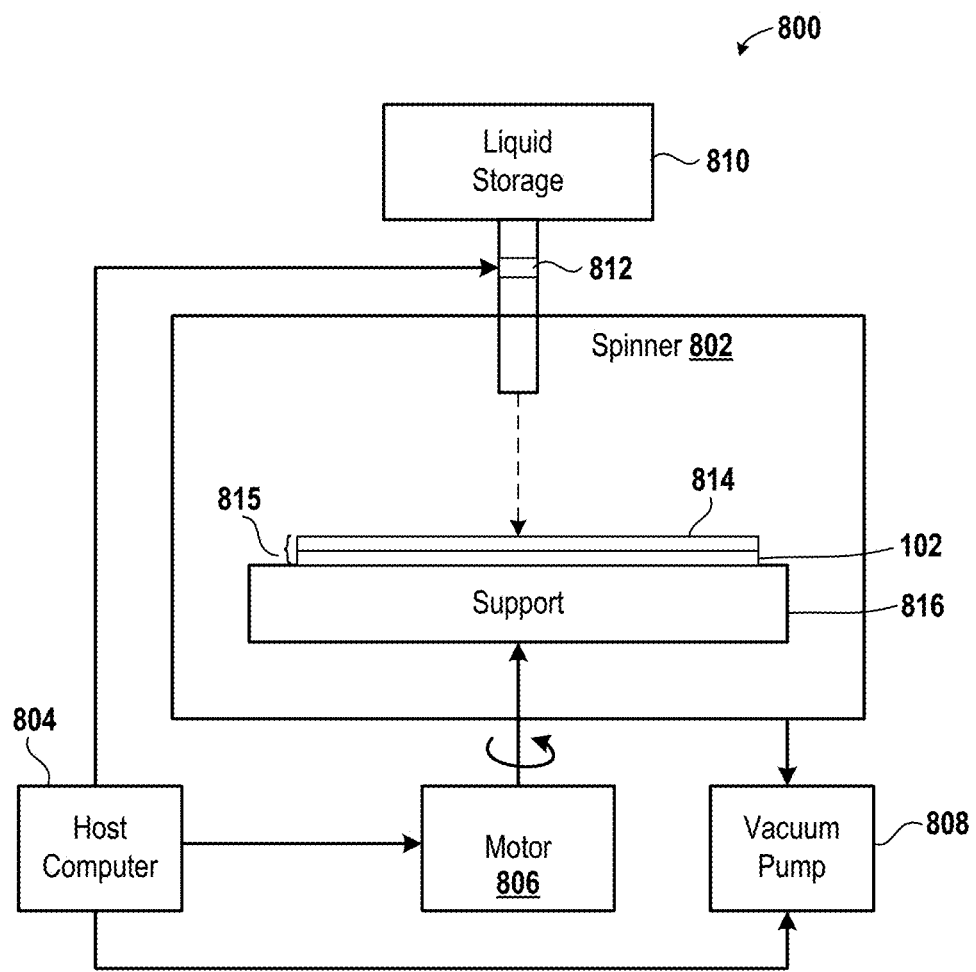
FIG. 8 is a diagram of an embodiment of a system that includes a spinner for deposition of a dielectric layer or a photoresist layer over a substrate.

FIG. 8 is a diagram of an embodiment of the system 800 that includes a spinner 802. The system 800 includes the spinner 800, a host computer 804, a motor 806, a vacuum pump 808, and a liquid storage 810. The substrate 102 is placed on top of a support 816, e.g., a metal support, a plastic support, etc., within the spinner 802. The support 816 is connected to the motor 806 via one or more connection mechanisms, e.g., one or more rods, a combination of rods and gears, etc.

The motor 806 is coupled to the host computer 804, which is coupled to the vacuum pump 808 and a valve 812. The host computer 804 controls the valve 812 to open or close the valve 812. For example, the host computer 804 sends a signal to a valve driver, e.g., a conductor, to generate a current, which generates an electric field to open or close the valve 812. The opening of the valve allows passage of a liquid, e.g., the dielectric material deposited in the operation 150 (FIG. 1A), the photoresist deposited in the operation 160 (FIG. 1A), etc., to the spinner 802 to be deposited on a surface 814 over the substrate 102 of a substrate package 815. For example, the liquid is deposited at or close to a center of the surface 814. The substrate package 815 is an example of the substrate package 107 or the substrate package 109 (FIG. 1A). The surface 814 is an example of a top surface of the pad 122 (FIG. 1A, operation 150) or a top surface of the barrier and seed layer 123 (FIG. 1A, operation 160).

After depositing the liquid on the surface 814, the host computer 804 controls the motor 806 to operate to rotate the support 816. For example, the host computer 804 sends a control signal to a motor driver, e.g., one or more transistors, to generate a current signal. The current signal is sent to a rotor of the motor 806 to rotate the rotor with respect to a stator of the motor to rotate the support 816 via the connection mechanism. The rotation of the support 816 rotates the surface 814 to evenly spread the liquid on the surface 814 via a centrifugal force such that the liquid is deposited on the surface 814.

The host computer 804 controls the vacuum pump 808 to operate to remove any excess liquid within the spinner 802. For example, the host computer 804 sends a signal to a vacuum driver, e.g., one or more transistors, etc., to turn on the vacuum pump 808 to create a partial vacuum within the spinner 802 to remove any excess liquid from the spinner 802. In some embodiments, the vacuum pump 808 is operated by the host computer 804 before the liquid is allowed to enter into the spinner 802 from the liquid storage 810 to remove any excess remnant materials from the spinner 802.

Figure 9:
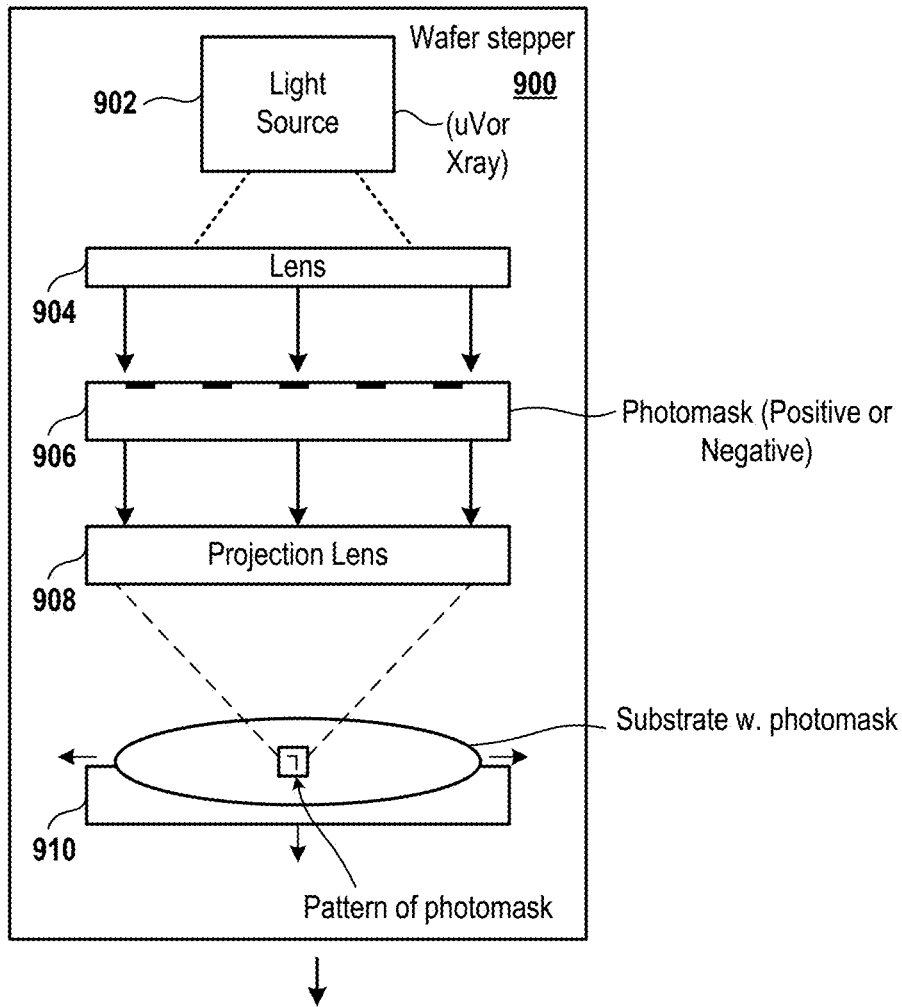
FIG. 9 is a diagram of an embodiment of a wafer stepper for illustrating formation of a pattern on a dielectric layer or a photoresist layer.
Figure 10:
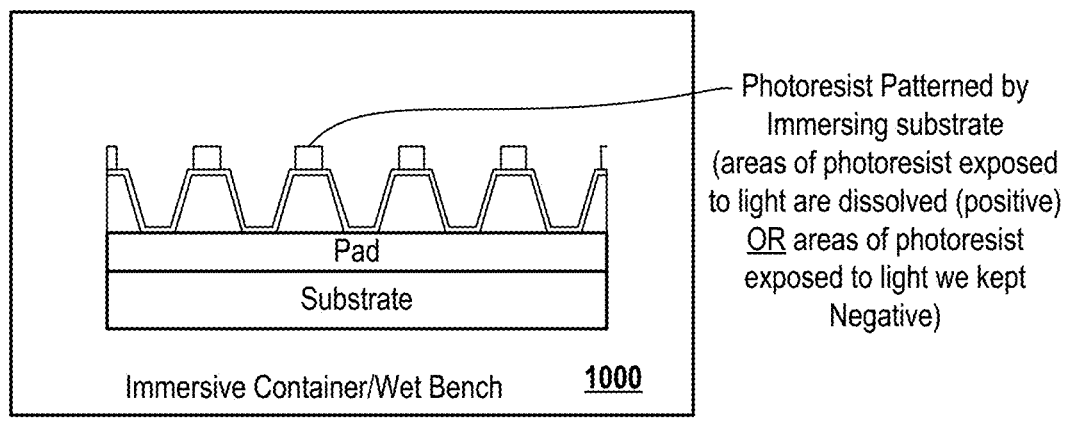
FIG. 10 is a diagram of an embodiment of an immersive container to illustrate stripping of portions of a dielectric layer or portions of a photoresist layer on which a pattern is imposed.

FIG. 9 is a diagram of an embodiment of the wafer stepper 900 for illustrating formation of a pattern on a dielectric layer or a photoresist layer. Examples of the dielectric layer include the dielectric layer 124 (FIG. 1A), the dielectric layer 502 (FIG. 5), and the dielectric layer 602 (FIG. 6). Examples of the photoresist layer include the photoresist layer 108 (FIG. 1A).

The wafer stepper 900 includes a light source 902, e.g., an ultraviolet (UV) light source, an X-ray light source, etc., a lens 904, a photomask 906, and a projection lens 908. An example of the UV light source includes a mercury-vapor lamp. The substrate 102 (FIG. 1A) over which one or more layers, e.g., the photoresist layer, the dielectric layer, etc., are deposited is placed on a substrate holder 910 within the wafer stepper 900.

The light source 902 generates light, e.g., UV light, x-ray, etc., that passes through the lens 904. The lens 904 directs, e.g., focuses, the light towards the photomask 906. The directed light passes through areas of the photomask 906 that allow passage of the directed light and is incident on the projection lens 908. The projection lens 908 directs the incident light on a portion of the layer, e.g., a dielectric layer described herein, a photoresist layer described herein, on which the pattern is to be imposed, e.g., imprinted, overlaid, etc. The light that is directed on the layer overlays the pattern on the layer deposited over the substrate 102. The substrate holder 910 is moved in x and y directions to repeat the imposition of the pattern.

FIG. 10 is a diagram of an embodiment of the immersive container 1000 to illustrate stripping of a dielectric layer or a photoresist layer on which the pattern is imposed. The immersive container 1000 is filled with a chemical solution, e.g., a developer, deionized water combined with nitrogen, deionized water, etc., to remove areas of the dielectric layer that are exposed to light or the photoresist layer that are exposed to light. If the photoresist of the photoresist layer is positive, regions of the photoresist that are exposed to the light become soluble in the developer when immersed. On the other hand, if the photoresist of the photoresist layer is negative, regions of the photoresist that are not exposed to the light become soluble in the developer when immersed. An example of photolithography is described in US Patent Application Publication No. 2008/0171292, which is incorporated by reference herein in its entirety.

FIG. 11 is a diagram of an embodiment of the system 1100 for illustrating the PVD process. The system 1100 includes a radio frequency generator (RFG) 1102, an impedance matching circuit (IMC) 1104, a plasma chamber 1106, a container 1108 for storage of one or more process gases, the host computer 804, another RFG 1112, another IMC 1114, and a vacuum pump 1116.

An IMC includes multiple electrical components, e.g., one or more capacitors, or one or more resistors, or one or more inductors, or a combination of one or more capacitors and one or more resistors, or a combination of one or more capacitors and one or more inductors, or a combination of one or more resistors and one or more inductors, or a combination of one or more capacitors and one or more resistors and one or more inductors. Some of the one or more electrical components are coupled with each other in a serial manner or a parallel manner.

The host computer 804 is a desktop computer, or a laptop computer, or a smartphone. The host computer 804 includes one or more processors and one or more memory devices coupled to the one or more processors. As used herein, a processor is an application specific IC, or a programmable logic device, or a microprocessor, or a central processing unit (CPU). Moreover, as used herein, a memory device is a random access memory (RAM) or a read-only memory (ROM) or a combination of RAM and ROM. The host computer 804 is coupled to the RFG 1102 via a cable, e.g., a serial data transfer cable, a parallel data transfer cable, a universal serial bus (USB) cable, etc. Similarly, the host computer 804 is coupled to the RFG 1112 via another cable, e.g., a serial data transfer cable, a parallel data transfer cable, a USB cable, etc.

The RFG 1102 is coupled to the IMC 1104 via an RF cable 1126 and the IMC 1104 is coupled to the top plate 1122 via an RF transmission line 1128. Moreover, the RFG 1112 is coupled to the IMC 1114 via an RF cable 1130 and the IMC 1114 is coupled to the chuck 1120 via an RF transmission line 1132.

The plasma chamber 1106 includes a chuck, e.g., an electrostatic chuck (ESC) on which a substrate package 1124 is placed, a top plate 1122, and other parts (not shown), e.g., an upper dielectric ring surrounding the top plate 1122, an upper electrode extension surrounding the upper dielectric ring, a lower dielectric ring surrounding a lower electrode of the chuck 1120, a lower electrode extension surrounding the lower dielectric ring, an upper plasma exclusion zone (PEZ) ring, a lower PEZ ring, etc. Examples of the substrate package 1124 include the substrate package 105 (FIG. 1A), or the substrate package 503 (FIG. 5), or the substrate package 603 (FIG. 6). The top plate 1122 is located opposite to, on top of, and facing the chuck 1120. Each of the top plate 1122 and the chuck 1120 is made of a metal, e.g., aluminum, alloy of aluminum, copper, a combination of copper and aluminum, etc. Examples of the process gases stored in the container 1108 include a sputtering gas, argon, etc.

The host computer 804 sends a signal to a valve driver, examples of which are provided above, to open a valve 1124. When the valve 1124 is open, the process gases flow from the container 1108 via an inlet of the plasma chamber 1106 into the plasma chamber 1106. Moreover, upon receiving a control signal from the host computer 804 via the cable, the RFG 1102 generates an RF signal that is supplied to the IMC 1104. Upon receiving the RF signal from the RFG 1102, the IMC 1104 matches an impedance of a load coupled to an output of the IMC 1104 with that of a source coupled to an input of the IMC 1104 to generate a modified RF signal. Examples of the load coupled to the IMC 1104 include the plasma chamber 1106 and the RF transmission line 1128. Examples of the source coupled to the IMC 1104 include the RFG 1102 and the RF cable 1126. The modified RF signal is sent from the IMC 1104 via the RF transmission line 1128 to the top plate 1122.

Similarly, upon receiving a control signal from the host computer 804 via the cable, the RFG 1112 generates an RF signal that is supplied to the IMC 1114. Upon receiving the RF signal from the RFG 1112, the IMC 1114 matches an impedance of a load coupled to an output of the IMC 1114 with that of a source coupled to an input of the IMC 1114 to generate a modified RF signal. Examples of the load coupled to the IMC 1114 include the plasma chamber 1106 and the RF transmission line 1132. Examples of the source coupled to the IMC 1114 include the RFG 1112 and the RF cable 1130. The modified RF signal is sent from the IMC 1114 via the RF transmission line 1132 to the chuck 1120.

The supply of the modified RF signal to the top plate 1122, the modified RF signal to the chuck 1120, and the process gases via the inlet to the plasma chamber 1106 generates plasma, such as strikes plasma, within the plasma chamber 1106. The plasma includes ions of the process gases and the ions react with a layer of a target material that is attached to the top plate 1122. Examples of the target material include a material of a material of the barrier layer, described herein, and a material of the copper seed layer, described herein. To illustrate, the target material is copper or titanium or tungsten or tantalum, or a combination of two or more of titanium, tungsten, and tantalum.

When the ions interact with the target material, the target material is sputtered from the layer of the target material to be deposited on top of the substrate package 1124. For example, the barrier layer or the copper seed layer is formed on top of the intermediate portions 124A and 124B (FIG. 1A) of the patterned dielectric layer and on top of the portion 156 of the pad 122 (FIG. 1A). The vacuum pump 1116 is operated to create a partial vacuum within the plasma chamber 1106 to remove remnant materials from the plasma chamber 1106.

In some embodiments, instead of sputtering the target material, the PVD process includes thermal evaporation. The thermal evaporation is a deposition technique in which a source material is heated to be vaporized. The vaporized source material is deposited on the substrate package 1124.

FIG. 12 is a diagram of an embodiment of the system 1200 for performing the operation 172 of photoresist stripping, the descum operation 164, and the operation 174 of barrier and seed layer etching (FIG. 1B). The system 1200 includes the RFG 1102, the IMC 1104, the RFG 1112, the host computer 804, a plasma chamber 1202, a container 1204 for storing one or more process gases, and another container 1205 for storing one or more etchants.

The plasma chamber 1202 includes a showerhead 1210 and the chuck 1120. The showerhead 1210 is facing the chuck 1120. The showerhead 1210 includes multiple holes to allow the one or more process gases stored in the container 1204 to be applied to a substrate package 1208 placed on the chuck 1210. The showerhead 1210 also includes an upper electrode plate. In some embodiments, the upper electrode plate of the showerhead 1210 is made from aluminum, or an alloy of aluminum, or copper, or a combination of copper and aluminum, etc.

To etch the copper seed layer, an etchant, e.g., the copper etchant, an acid, etc., is supplied from the container 1205 via a valve 1207 to the showerhead 1210. The host computer 804 controls the valve 1207 via a valve driver, described above, to open the valve 1207. The etchant is supplied via the showerhead 1210 to the substrate package 1208 to etch away the copper seed layer. Similarly, to etch the barrier layer, a barrier etchant, e.g., an acid, etc., is supplied from the container 1205 via the valve 1207 to the showerhead 1210. The barrier etchant when applied to the substrate package 1208 etches away the barrier layer.

During the photoresist stripping operation 172 (FIG. 1B) or the descum operation 164, the host computer 804 sends a signal via a valve driver, which is described above, to open a valve 1206. When the valve 1206 is open, one or more process gases, e.g., carbon dioxide, oxygen, an etchant gas, etc., stored within the container 1204 are supplied. Moreover, the modified RF signal is supplied via the RF transmission line 1132 to the chuck 1120. Also, the modified RF signal is supplied via the RF transmission line 1128 to the upper electrode plate of the showerhead 1210.

When the modified signals are supplied to the showerhead 1210 and to the chuck 1120, the one or more process gases supplied to the plasma chamber 1202 are ignited to strike plasma within the plasma chamber 1202. The plasma performs the photoresist stripping operation 172 or the descum operation 164 on the substrate package 1208. To illustrate, when the one or more process gases include carbon dioxide or an etchant gas, the photoresist stripping operation 172 is performed. As another illustration, when the one or more process gases include oxygen or an etchant gas, the descum operation 164 is performed.

It should be noted in some embodiments, an RFG other than the RFG 1102, an RF cable other than the RF cable 1126, an IMC other than the IMC 1104, an RF transmission line other than the RF transmission line 1128, an RFG other than the RFG 1112, an RF cable other than the RF cable 1130, an IMC other than the IMC 1114, and an RF transmission line other than the RF transmission line 1132 is used in the system 1200.

It should further be noted that the substrate package 1208 is an example of the substrate package 135 (FIG. 1B) when the descum operation 164 is performed on the substrate package 1208. Moreover, the substrate package 1208 is an example of the substrate package 137 (FIG. 1B) when the photoresist stripping operation 172 is performed on the substrate package 1208. Also, the substrate package 1208 is an example of the substrate package 139 (FIG. 1B) when the barrier and copper seed etch operation 174 is performed on the substrate package 1208.

In some embodiments, the operation 172 of photoresist stripping and the operation 174 of barrier and seed layer etching are quite often performed in one and the same process tool, e.g., a process tool other than the system 1200, and the descum operation 164 is performed using the system 1200. Furthermore, a solvent-based wet chemistry is applied within the process tool for performing the operation 172 of photoresist stripping with a single wafer spray system. Likewise, a copper etchant, e.g., a dilute piranha solution, etc., is dispensed via the single wafer spray system over the substrate 102 to etch a copper seed layer, described herein.

FIG. 13A is a diagram of an embodiment of a system 1300 for illustrating the pre-treatment operation 166 (FIG. 1B). The system 1300 includes a chamber 1302, a motor 1304, and a container 1306. The motor 1304 is coupled to the wafer holder 1308 via one or more connection mechanisms, which are described above. The wafer holder 1308 holds a substrate package 1312. The substrate package 1312 is an example of the substrate package 135 (FIG. 1B) on which the descum operation 164 has been performed and the pre-treatment operation 166 is to be performed.

The host computer 804 sends a signal to a valve driver, described above, to further open a valve 1310. When the valve 1310 is open, a pre-wet fluid, e.g., water, a water-miscible solvent, a chemistry solution, deionized water, a combination of deionized water and the chemistry solution, etc., from the container 1306 flows into the chamber 1302. Moreover, the host computer 804 sends a signal to a motor driver, described above, to operate the motor 1304. The motor 1304 operates, e.g., rotates, etc., to lower a position of the wafer holder 1308 to enable the substrate package 1312 to be immersed into the pre-wet fluid in the chamber 1302.

Once the substrate package 1312 is pre-wetted, the motor 1304 is operated to raise the wafer holder 1312 to remove the substrate package 1312 from being immersed in the pre-wetting fluid. The motor 1304 is further operated to rotate the wafer holder 1312 to remove the pre-wetting fluid from a surface of the substrate package 1312. Before, during, or after the pre-treatment operation 166, the vacuum pump 1116 is operated to remove any undesirable remnant materials, e.g., the pre-wetting fluid, from a surface of the substrate package 1312, etc., from the chamber 1302.

FIG. 13B is a diagram of an embodiment of a system 1320 for illustrating the pre-treatment operation 166 (FIG. 1B). The system 1320 includes a chamber 1322, the motor 1304, and the container 1306. The motor 1304 is coupled to a chuck 1324 via one or more connection mechanisms, which are described above. The chuck 1324 holds a substrate package 1312. For example, the chuck 1324 has arms orientated at equal angles, e.g., 120 degrees, around a circumference of the substrate package 1312 to hold the substrate package 1312.

The host computer 804 sends a signal to a valve driver, described above, to open the valve 1310. When the valve 1310 is open, the pre-wet fluid from the container 1306 is dispensed or sprayed into the chamber 1322 on top of the substrate package 1312.

Moreover, the host computer 804 sends a signal to a motor driver, described above, to operate the motor 1304. The motor 1304 operates, e.g., rotates, etc., to rotate the substrate package 1312 while the substrate package 1312 is being held by the chuck 1324 and while the pre-wet fluid is being applied to the substrate package 1312. The substrate package 1312 is being held to reduce chances of slipping or moving of the substrate package 1312. In some embodiments, the motor 1304 is not being operated while the pre-wet fluid is being applied to the substrate package 1312.

Once the substrate package 1312 is pre-wetted, the motor 1304 is operated to rotate the chuck 1324 to remove the pre-wetting fluid from the surface of the substrate package 1312 to be collected at a bottom of the chamber 1324. Before, during, or after the pre-treatment operation 166, the vacuum pump 1116 is operated to remove the undesirable remnant materials from the chamber 1324.

FIG. 14A is a diagram of an embodiment of a system 1400 for illustrating the electrodeposition operation 168 (FIG. 1B). The system 1400 includes the host computer 804, a rotatable spindle 1418, a chamber 1420, a container 1422 for storing the catholyte, and a pump 1424. Examples of the catholyte include a liquid made of the conductive material 112, e.g., copper, or cobalt, or copper sulfate, or invar, or a combination of two or more of cobalt, invar, copper sulfate, and copper. In some embodiments, the catholyte includes the liquid made of the conductive material and further includes a combination of one or more accelerators and one or more levelers. In various embodiments, the catholyte includes the liquid made of the conductive material and further includes a combination of one or more accelerators and one or more suppressors. In several embodiments, the catholyte includes the liquid made of the conductive material and further includes a combination of one or more accelerators and one or more suppressors and one or more levelers. An accelerator accelerates filling of the conductive material 112 within a via, e.g., the via 106 (FIG. 1A), the via 504 (FIG. 5), the via 604 (FIG. 6), etc., to overfill the via to form a bump, e.g., the bump 114 (FIG. 1B). The suppressor suppresses, e.g., reduces acceleration, decelerates, etc., of filling of the conductive material 112 in portions of the via, e.g., the via 106 (FIG. 1A), the via 504 (FIG. 5), the via 604 (FIG. 6), etc. To illustrate, when the conductive material 112 is to be filled primarily at a bottom surface of the via, e.g., the via 106, or the via 504 or the via 604, etc., the suppressor suppresses the filing of the conductive material 112 at side surfaces of the via. The side surfaces are adjacent to the bottom surface and are angled, e.g., slanted, positively sloped, negatively sloped, etc., with respect to the bottom surface. The leveler levels the conductive material 112 to form a leveled layer, e.g., the leveled layer LL1, the leveled layer LL2 (FIG. 1B), etc., of the conductive material 112 on top of another layer, e.g., the portion 132A of the barrier and seed layer 123, the portion 132B of the barrier and seed layer 123 (FIG. 1B), etc. In some embodiments, the catholyte is a plating chemistry that includes the liquid made of the conductive material and further includes additives, e.g., a combination of an accelerator, a suppressor, and a leveler.

A substrate package 1404 is held, positioned, and rotated by a wafer holder 1406 of the chamber 1420. The chamber 1420 includes a plating cell 1408, which is dual chamber cell having an anode chamber with, for example, a counter electrode 1409, e.g., a copper electrode, etc., and anolyte. The anode chamber and cathode chamber are separated by, for example, a membrane 1410, e.g., a cationic membrane, which is used for electrodeposition and is supported by a support member 1412. The system 1400 further includes a channeled ionically resistive plate (CIRP) 1414. A flow diverter 1416 is on top of the CIRP 1414, and aides in creating a transverse shear flow of the catholyte. The catholyte is introduced from the container 1422 via flow ports 1433 above the cationic membrane 1410. From the flow port 1433, the catholyte passes through the CIRP 1414 and produces impinging flow onto a surface, e.g., on top of the portions 132A and 132B of the barrier and seed layer 123 (FIG. 1B) and on top of the portion 130 of the barrier and seed layer 123 (FIG. 1B), etc., of the substrate package 1404 to overfill the via 106 to create the bump 114 and to deposit the conductive material 112 on the portions 132A and 132B to create the leveled layers LL1 and LL2. Moreover, the catholyte is introduced from the container 1422 via the pump 1424 into a flow port 1430, which is located at a side 1402 of the chamber 1420. For example, an inlet of the flow port 1430 is located below the anode 1408. In this example, the flow port 1430 is a channel in a side wall 1432 of the plating cell 1408. The functional result is that catholyte flow is introduced directly into a plating region formed between the CIRP 1414 and the substrate package 1404 to enhance the transverse shear flow across the substrate package 1404 as shown by a direction 1407 of the arrow in FIG. 14A. For example, the transverse shear flow is in the direction 1407 that is parallel to the top surface 120 of the leveled layers LL1 and LL2. The transverse shear flow is applied between the adjacent areas A1 and A2 to create the bump 114 between the leveled layers LL1 and LL2.

Moreover, when the catholyte having the conductive material 112 and a combination of two or more of an accelerator, a suppressor, and a leveler is introduced into the chamber 1420 on the substrate package 1404, the host computer 804 controls a direct current (DC) power source 1434 of the system 1400 to supply DC power to the counter electrode 1409 and to the wafer holder 1406. The wafer holder 1406 is positively charged by the DC power to serve as a cathode and the counter electrode 1409 is negatively charged by the DC power to serve as an anode to enable electrodeposition of ions of the catholyte onto the substrate package 1404. In some embodiments, for the electrodeposition operation 168, the wafer holder 1406 and the substrate package 1404 serve as the cathode and involve the reduction of $Cu^{2+} \rightarrow Cu$, while the anode is oxidized from $Cu \rightarrow Cu^{2+}$. In these embodiments, the anode includes copper.

FIG. 14B is a diagram of an embodiment of the system 1401 to illustrate the electropolishing operation 170 (FIG. 1B). The system 1401 is similar in structure and components to the system 1400 (FIG. 14A) except that the system 1401 includes a chamber 1421 and a container 1423. The chamber 1421 is similar in structure and components to the chamber 1420 (FIG. 14A) except that the chamber 1421 includes a counter electrode 1411. When an acid, e.g., phosphoric acid, hydrochloric acid, sulfuric acid, etc., is stored inside a container 1423 and is used instead of the catholyte and is introduced into the chamber 1421 on the substrate package 1404, the host computer 804 controls the DC power source 1434 of the system 1401 to supply DC power to the counter electrode 1411 and to the wafer holder 1406. The wafer holder 1406 is negatively charged by the DC power to serve as an anode and the counter electrode 1411 is positively charged by the DC power to serve as a cathode to enable electropolishing of bumps, such as the bump 114, of the substrate package 1404. The anodic reaction is of $Cu \rightarrow Cu^{2+}$ and the cathode reaction includes $2H^+ \rightarrow H_2$. The cathode is fabricated from an inert material, such as, e.g., titanium, or platinum, or iridium, or a combination of two or more thereof.

The flow diverter 1416 is on top of the CIRP 1414, and aides in creating a transverse shear flow of the acid. The acid is introduced from the container 1422 via flow ports 1433 above the membrane 1410. From the flow port 1433, the acid passes through the CIRP 1414 and produces impinging flow onto a surface, e.g., on top of the bump 114, of the substrate package 1404 to remove the bump 114 to create the top surface 120 (FIG. 1B) of the RDL layer 104. Moreover, the acid is introduced from the container 1423 via the pump 1424 into the flow port 1430. The functional result is that the acid flow is introduced directly into a region formed between the CIRP 1414 and the substrate package 1404 to enhance the transverse shear flow across the substrate package 1404 as shown by the direction 1407 of the arrow in FIG. 14B. The transverse shear flow is applied between the adjacent areas A1 and A2 to the bump 114 between the leveled layers LL1 and LL2 to remove the bump 114 to further create the leveled area LL3.

It should be noted that the substrate package 1404 is an example of the substrate package 135 when the electrodeposition operation 168 (FIG. 1B) is to be performed on the substrate package 1404. Moreover, it should be noted that the substrate package 1404 is an example of the substrate package 141 (FIG. 1B) when the electropolishing operation 170 (FIG. 1B) is to be performed on the substrate package 1404.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for fabricating a redistribution layer, the method comprising:
   depositing a dielectric layer on top of a pad located on a substrate;
   creating at least one via within the dielectric layer, wherein the dielectric layer has at least two intermediate portions and the at least one via extending therebetween;
   depositing a barrier and seed layer on top the dielectric layer, wherein said depositing forms a film on the at least one via and on top of the at least two intermediate portions;
   providing a layer of photoresist on top of the film of the barrier and seed layer, wherein the photoresist layer extends into the at least one via;
   patterning the photoresist layer over the at least one via, wherein the patterning exposes at least a portion of an upper surface of the barrier and seed layer adjacent to the at least one via;
   overfilling the redistribution layer within the at least one via and laterally extending the redistribution layer on top of the exposed upper surface of the barrier and seed layer, wherein said overfilling defines a localized bump over the at least one via and the redistribution layer has a height that is less than a height of the patterned photoresist layer; and
   selectively removing the localized bump of the redistribution layer, wherein the localized bump is selectively removed while the height of the patterned photoresist layer is maintained.

2. The method of claim 1, further comprising stripping the patterned photoresist layer, subsequent to the removal of the localized bump of the redistribution layer.

3. The method of claim 1, wherein the localized bump of the redistribution layer has a height that is less than the height of the patterned photoresist layer.

4. The method of claim 1, wherein the redistribution layer is made from cobalt, or invar, or nickel, or an alloy of nickel and cobalt and iron, or a combination of two or more thereof.

5. The method of claim 1, wherein the redistribution layer is a conductive metal.

6. The method of claim 1, wherein the conductive metal of the redistribution layer is copper or an alloy of copper.

7. The method of claim 5, wherein the conductive metal of the redistribution layer is selected from a group consisting of cobalt, invar, nickel, an alloy of nickel and iron, an alloy of nickel and cobalt, an alloy of cobalt and iron, and an alloy of nickel and cobalt and iron.

8. The method of claim 1, wherein the selective removal of the localized bump is performed by employing a liquid chemistry that is selective to a conductive material of the redistribution layer relative to a material of the photoresist layer, wherein the liquid chemistry facilitates applying a shear force in a horizontal direction that is parallel to the redistribution layer and to the patterned photoresist layer.

9. The method of claim 1, wherein said overfilling includes simultaneously applying a conductive material with an accelerator and a leveler, wherein said simultaneous applying fabricates an additional bump and leveled portions of the redistribution layer, wherein one of the leveled portions is created between the localized bump and the additional bump.

10. The method of claim 9, further comprising simultaneously applying a suppressor with the conductive material, the accelerator, and the leveler, wherein said simultaneously applying suppresses the conductive material that is deposited over side surfaces of the at least one via.

11. The method of claim 1, wherein the localized bump has a width that is smaller than a maximum width of one of the at least one via over which of the localized bump is formed.

12. The method of claim 1, wherein said removing the localized bump is performed by a flow of an acid in a transverse direction on the localized bump of the redistribution layer and on the patterned photoresist layer.

13. The method of claim 12, wherein the acid is a phosphoric acid.

14. The method of claim 6, wherein the alloy of copper includes a combination of copper and cobalt, or a combination of copper and invar, or a combination of copper and nickel, or a combination of copper and an alloy of nickel and cobalt and iron.

15. The method of claim 1, wherein the localized bump is a bump formed over the at least one via.

* * * * *